(12) United States Patent
Chen et al.

(10) Patent No.: US 6,628,216 B2
(45) Date of Patent: Sep. 30, 2003

(54) CALIBRATION OF RESISTOR LADDER USING DIFFERENCE MEASUREMENT AND PARALLEL RESISTIVE CORRECTION

(75) Inventors: Hsin-Shu Chen, Melbourne, FL (US); Kantilal Bacrania, Palm Bay, FL (US); Eric C. Sung, Palm Bay, FL (US); J. Mikko Hakkarainen, Palm Beach Gardens, FL (US); Bang-Sup Song, La Jolla, CA (US); Brian L. Allen, West Melbourne, FL (US); Mario Sanchez, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/207,340

(22) Filed: Jul. 29, 2002

(65) Prior Publication Data

US 2003/0151532 A1 Aug. 14, 2003

Related U.S. Application Data

(63) Continuation-in-part of application No. 10/097,677, filed on Mar. 13, 2002.
(60) Provisional application No. 60/356,610, filed on Feb. 13, 2002.

(51) Int. Cl.[7] .............................. H03M 1/10; H03M 1/78
(52) U.S. Cl. ....................................... 341/120; 341/154
(58) Field of Search ................................ 341/118, 120, 341/155, 159, 154; 702/107

(56) References Cited

U.S. PATENT DOCUMENTS

| | | | | |
|---|---|---|---|---|
| 6,178,388 B1 | * | 1/2001 | Claxton | ...................... 702/107 |
| 6,188,346 B1 | | 2/2001 | Waho et al. | |
| 6,204,785 B1 | * | 3/2001 | Fattaruso et al. | ............ 341/120 |
| 6,459,394 B1 | * | 10/2002 | Nadi et al. | ................... 341/120 |

OTHER PUBLICATIONS

Shu et al., "A 13–b, 10–Msample/ADC Digitally Calibrated with Oversampling Delta–Sigma Converter," IEEE Journal of Solid–State Circuits, vol. 30, No. 4, Apr. 1995, pp. 443–452, ISSN: 0018–9200/85.
Kwak et al., "A 15–b, 5–Msample/s Low–Spurious CMOS ADC," IEEE Journal of Solid–State Circuits, vol. 32, No. 12, Dec. 1997, pp. 1888–1875, ISSN: 0018–9200/97.
Fu et al., "A Digital Background Calibration Technique for Time–Interleaved Analog–to–Digital Converters," IEEE Journal of Solid–State Circuits, vol. 33, No. 12, Dec. 1998, pp. 1904–1911, ISSN: 0018–9200/98.
Erdogan et al., "A 12–b Digital–Background–Calibrated Algorithmic ADC with–90–dB THD," IEEE Journal of Solid–State Circuits, vol. 34, No. 12, Dec. 1999, pp. 1812–1820, ISSN: 0018–9200/99.

(List continued on next page.)

Primary Examiner—Patrick Wamsley
(74) Attorney, Agent, or Firm—Gary R. Stanford

(57) ABSTRACT

A calibration system and method for a resistor ladder that employs relative measurement and adjustment between pairs of resistors. The system includes a resistor tree of complementary pairs of programmable resistors coupled to the resistor ladder, a measurement circuit that measures voltage differences between complementary pairs of programmable resistors, and control logic. The control logic controls the measurement circuit to measure a voltage difference between each complementary pair of programmable resistors and adjusts the relative resistance of each complementary pair of programmable resistors to equalize voltage. The measurement is facilitated by a sigma-delta ADC that converts a measured voltage difference into a bit stream. The programmable resistors are implemented with binary weighted resistors that are digitally adjusted one LSB at a time. Lower and upper adjustment thresholds may be employed to avoid unnecessary over-adjustments while maintaining a requisite level of accuracy.

25 Claims, 11 Drawing Sheets

OTHER PUBLICATIONS

Dyer, et al., "FA 9.3: Analog Background Calibration of a 10b 40MSample/s Parallel Pipelined ADC," IEEE International Solid–State Circuits Conference, IEEE 1998, pp. 9.3–1 –9.3–11.

Fu et al., "FA 9.2: Digital Background Calibration of a 10b 40MSample/s Parallel Pipelined ADC," IEEE International Solid–State Circuits Conference, IEEE 1998, pp. 9.2–1 – 9.2–11.

Choe, et al., "MP 2.2: A 13b 40MSample/s CMOS Pipelined Folding ADC with Background Offset Trimming," 2000 IEEE International Solid–State Circuits Conference, 07803–5853–8/00, 10 pages.

* cited by examiner

US 6,628,216 B2

CALIBRATION OF RESISTOR LADDER USING DIFFERENCE MEASUREMENT AND PARALLEL RESISTIVE CORRECTION

CROSS-REFERENCE TO RELATED APPLICATION(S)

The present application is based on U.S. Provisional Patent Application entitled "An Analog To Digital Converter", Ser. No. 60/356,610, filed Feb. 13, 2002, which is hereby incorporated by reference in its entirety. The present application is also a Continuation-In-Part of U.S. patent application entitled "An Analog To Digital Converter Using Subranging And Interpolation", Ser. No. 10/097,677, filed Mar. 13, 2002, which is also incorporated herein by reference in its entirety.

FIELD OF THE INVENTION

The present invention relates to calibration, and more particularly to calibration of a resistor ladder using parallel resistive correction based on voltage difference measurements.

DESCRIPTION OF RELATED ART

Many electronic functions employ a resistor ladder to provide a sequential series of reference voltages. The present disclosure, for example, describes an analog to digital converter (ADC) that employs a reference resistor ladder to provide reference voltages for purposes of comparison and digital conversion. The desired level of linearity, accuracy and resolution of the particular ADC described herein is relatively high and requires 14-bit resolution of the input signal. The level of accuracy necessary for the resistor ladder depends upon the intended use of the ladder within the ADC. The ADC described herein employs the reference resistor ladder at the front end during initial conversion that is used to maintain the accuracy throughout the conversion process. For example, a selected portion of the reference voltages are applied as first inputs to preamplifiers, where the second inputs of each preamplifier is the sampled analog signal. In this manner, it is desired that the reference resistor ladder maintain better than 15-bit accuracy. It is noted that the present invention is not limited to ADC applications but may be applied to any application in which a resistor ladder is employed and in which it is desired to maintain a requisite accuracy level.

The ADC is intended to be incorporated into a monolithic unit on one substrate of an integrated circuit (IC) or chip. The overall passive component match for most silicon process is 0.1% in accuracy. This translates into overall accuracy of approximately 10 bits. Only a slight improvement is possible by careful optimization and use of dummy components in the layout of the passives. Sometimes, statistical matching using arrays of passives can yield up to an order of magnitude improvement in the overall accuracy.

Correction and calibration techniques are known to improve the resolution, such as laser trimming or fuse blowing. Such post-processing techniques, however, must be performed on a part-by-part basis thereby unduly complicating and increasing cost of the manufacturing process. Also, such post-processing techniques operate under fixed conditions and do not correct for inaccuracies or changes due to temperature, aging and/or operating conditions. Digital calibration techniques are also known and usually operate to measure error at the backend and apply a correction factor. These calibration techniques are limited by quantization of the calibrator and usually limits the correction to one-half bit of resolution of the converter itself. Also, the calibration techniques are incorporated in silicon and thus subject to the same limitations of the target circuitry.

It is desired to provide calibration for a resistor ladder that is not limited by the underlying substrate, that does not interfere with or overly complicate the manufacturing process, and that corrects for any potential inaccuracies that may arise during normal operation.

SUMMARY OF THE INVENTION

A calibration system for a resistor ladder includes a resistor tree of calibration resistors, a measurement circuit, and control logic. The resistor tree includes a plurality of calibration resistor branches, where each branch includes one or more pairs of complementary programmable resistors coupled together at a common junction and coupled in parallel with ladder resistors requiring calibration. The measurement circuit measures a voltage difference between a selected portion of the resistor ladder associated with a complementary pair of programmable resistors. The control logic controls the measurement circuit to measure a voltage difference between each complementary pair of to programmable resistors and to adjust the relative resistance of each complementary pair of programmable resistors to achieve a more equal voltage if the voltage difference is greater than a predetermined magnitude.

The resistor tree may be configured as a binary tree in which each successive branch includes twice the number of programmable resistors as a prior branch. The control logic adjusts each complementary pair of programmable resistors by increasing resistance of a first by an adjust amount and by decreasing resistance of a second by the same adjust amount. Each programmable resistor may be configured as a binary weighted resistor subladder, where each binary weighted resistor subladder is programmed by a digital value. The control logic may adjust the relative resistance in any desired manner, such as by incrementing a first digital value by one least significant bit and by decrementing a second digital value by one least significant bit.

The calibration system may include first and second memories that store digital resistance values and digital update values, respectively. Each digital resistance value programs a resistance of a corresponding one of the programmable resistors of the resistor tree. Each digital update value corresponds to one of the digital resistance values. The control logic may adjust a programmable resistor by replacing a digital resistance value in the first memory with a corresponding digital update value from the second memory.

The measurement circuit may include an analog subtractor and a sigma-delta converter. The analog subtractor measures a voltage difference between a selected complementary pair of programmable resistors. The sigma-delta converter provides a bit stream representative of the measured voltage difference. The calibration system may include a counter that counts bits having a predetermined binary value (e.g. 1's or 0's) of the bit stream for a predetermined measurement interval and that provides a sum value. The control logic may include adjust logic that converts the sum value to an adjust value, that increases one digital update value by the adjust value and that decreases a complementary digital adjust value by the adjust value in the second memory for the measurement interval. The adjust logic may include digital compare logic, a digital adder and a digital subtractor. The digital compare logic compares the sum value with predetermined upper and lower thresholds and sets the adjust value to zero if the sum value is within both thresholds, sets the adjust value to one polarity if the upper threshold is reached and sets the adjust value to an opposite polarity if the lower threshold is reached. The digital adder adds the adjust value to a first digital update value and the digital subtractor subtracts the adjust value from a second digital update value that is complementary to the first digital update value.

The control logic may conduct a sequential measurement cycle in which it performs a sequential series of measurement intervals to measure and adjust each complementary pair of programmable resistors of the resistor tree to calibrate the corresponding portion of the resistor ladder. The control logic may be configured to continuously repeat each sequential measurement cycle during operation. Further, the control logic may assert an update signal after each measurement cycle that causes each digital resistance value in the first memory to be replaced by a corresponding digital update value in the second memory. The resistor ladder calibration system may be used for a resistor ladder that is used in a differential manner, where the number of calibrated resistors of the resistor ladder includes half the number of total ladder resistors.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF EMBODIMENT(S) OF THE INVENTION

Figure 1:
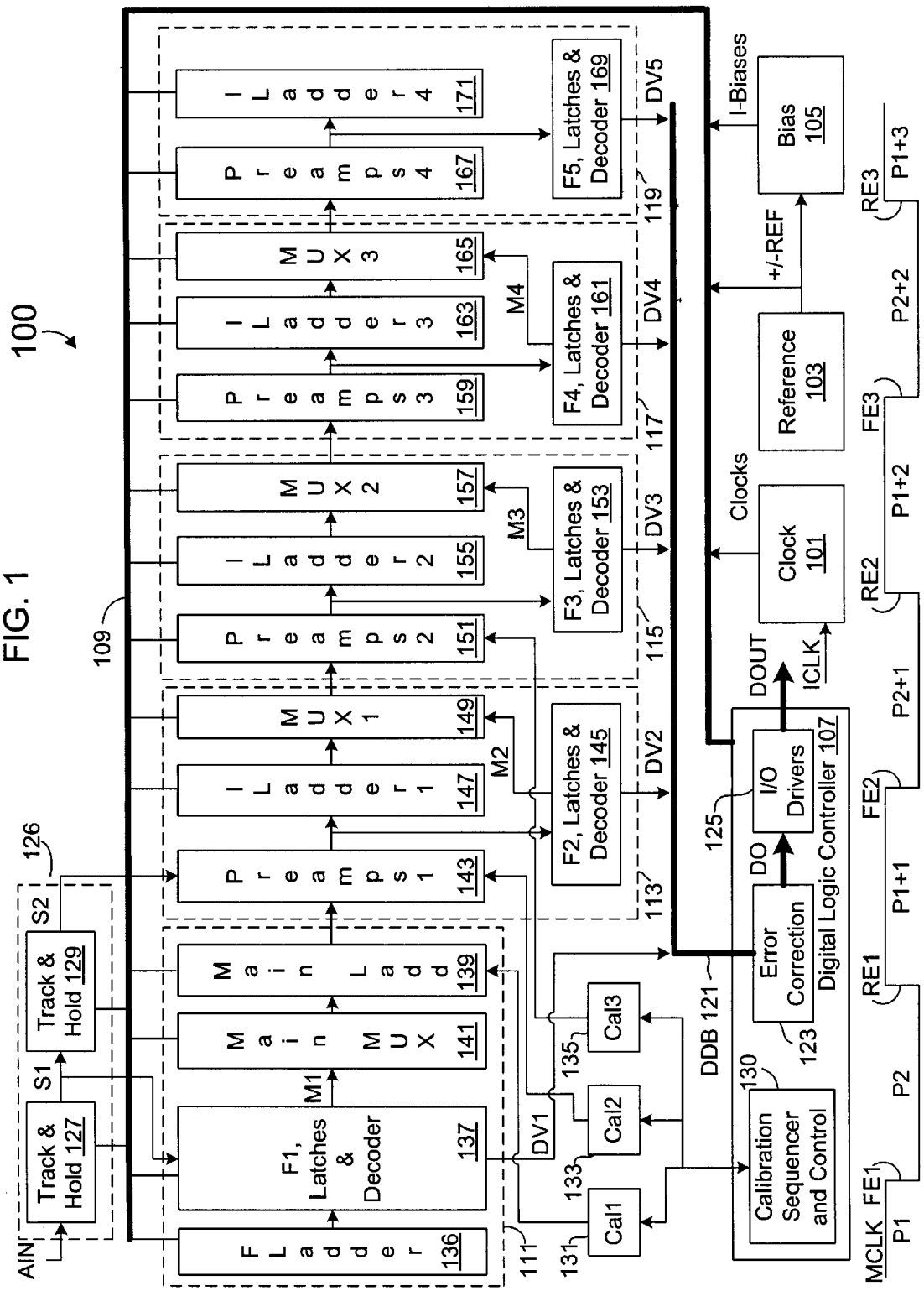
FIG. 1 is a block diagram of an exemplary analog to digital converter in accordance with an embodiment of the present invention.

FIG. 1 is a block diagram of an exemplary 14-bit analog to digital converter (ADC) 100 in accordance with an embodiment of the present invention. The ADC 100 includes support circuitry, such as a clock circuit 101, a reference circuit 103, a bias circuit 105 and a digital logic controller 107, all coupled together via a bias/clock bus 109. The clock circuit 101 receives an input clock signal ICLK and generates a plurality of clock signals "Clocks" for providing synchronization of the various components of the ADC 100. The reference circuit 103 generates reference voltage signals +REF and −REF that are sufficiently independent of temperature and power supply variations. The +/−REF signals are provided to the bias circuit 105, which develops a plurality of temperature-independent bias current signals "I-Biases" that provide current biasing for various components of the ADC 100 including preamplifiers within pipelined stages, as further described below.

The signals of the bias/clock bus 109 are distributed to other components of the ADC 100 for purposes of control, synchronization, biasing and support. The bias/clock bus 109 is not necessarily organized as a single bus but instead includes analog and digital control signals collectively shown for purposes of simplifying description without departing from the spirit and scope of the present invention. Also, many of the signals and components described herein are differential in form throughout the pipelined architecture of the ADC 100, although the principles of the present invention may be applied in a similar manner to single-ended signals and components.

In the exemplary embodiment shown, the ADC 100 is configured as a pipelined architecture with multiple stages including a first input stage 111 and one or more secondary stages 113, 115 and 117 and an output stage 119 that collectively convert a sampled analog signal, referred to as "AIN", into an output digital value. The stages are loosely defined based on a series of sequentially-coupled flash converters 137, 145, 153, 161 and 169, where each flash converter includes latches and decoders as further described below. Each of the stages 111–119 develops a corresponding 4-bit digital value DV1, DV2, DV3, DV4 and DV5, respectively, which are collectively provided to an error correction circuit 123 within the digital logic controller 107 via a 20-bit digital data bus (DDB) 121. The error correction circuit 123 converts the resulting 20-bit digital value on the DDB 121 into a 14-bit value referred to as "DO" to an input of a series of Input/Output (I/O) drivers 125. The I/O drivers 125 assert corresponding digital output signals, shown as "DOUT" signals, which are digital representations of the input analog signal AIN. The number of stages employed and the number of resolved bits per stage reflect the relative accuracy desired for the digital output. A different number of stages and/or number of resolved bits per stage may be used for different configurations or applications.

The ADC 100 includes a sample circuit 126 that regularly samples the AIN signal and that provides corresponding sample signals to the input stage 111. More particularly, the AIN signal is regularly sampled by a first track and hold circuit 127 for developing a first sample signal S1, which is provided to an input of a second track and hold circuit 129 and to an input of the first stage 111. The second track and hold circuit 129 samples the S1 signal at the same rate and asserts another sample signal S2 to an input of the second stage 113. In the exemplary embodiment illustrated, the clock circuit 101 asserts a master clock signal (MCLK) of approximately 80 MHz on the bias/clock bus 109. The MCLK signal is shown in FIG. 1 for purposes of illustration. In the embodiment shown, the track and hold circuit 127 samples the AIN signal at the MCLK rate and holds its output signal S1 at the sampled level for sampling by the track and hold circuit 129. The track and hold circuit 129 also samples the S1 signal at the MCLK rate and holds its output for use by the second stage 113. In the embodiment shown, the track and hold circuits 127, 129 operate in a make before break configuration so that the level of the S1 signal is transferred to the S2 signal. Although a single master clock signal is shown (MCLK), separate sample and hold clocks may be used to enable make before break operation. In any event, the track and hold circuit 129 operates like a memory to hold one sample of the AIN signal for additional time while another sample is being taken.

Each of the stages 111–119 includes a flash converter and at least one resistive ladder, where each flash converter includes latching comparators and a decoder. Each of the stages 111–117 includes select logic or a multiplexor (MUX) controlled by a corresponding flash converter for purposes of subranging resistive ladders. Each of the stages 113–119 includes a set of preamplifiers for amplifying selected subranges. The resistive ladders each operate as an interpolator to divide a voltage range applied at the inputs or across the resistive ladder into intermediate voltages. The applied voltage range is either a reference signal (as in the first stage 111) or a residual signal from a prior stage. The first stage 111 includes the first flash converter 137, a "flash" resistive ladder 136 (FLadder), a primary reference resistive ladder referred to as the "Main Ladder" 139 and a "Main" MUX 141 for selecting a subrange of the Main Ladder 139. The second stage 113 includes a set of preamplifiers 143 (Preamps1), the second (F2) 4-bit flash converter 145, a first interpolator resistive ladder (ILadder1) 147, and a MUX 149 (MUX1). The third stage 115 includes a set of preamplifiers 151 (Preamps2), the third (F3) 4-bit flash converter 153, a second interpolator resistive ladder (ILadder2) 155 and another MUX 157 (MUX2). The fourth stage 117 includes a set of preamplifiers 159 (Preamps3), the fourth 4-bit flash converter 161, a third interpolator resistive ladder 163 (ILadder3) and another MUX 165 (MUX3). The fifth and final stage 119 includes a set of preamplifiers 167 (Preamps4), the fifth (F5) 4-bit flash converter 169 and a fourth interpolator resistive ladder 171 (Illadder4). Although the ladders 147, 155, 163 and 171 are referred to as "interpolator" ladders referencing the interpolator function, each performs an additional function of averaging the voltage outputs of the preamplifiers 143, 151, 159 and 167, respectively, and thereby reducing any amplifier offsets. Also, the final ILadder4 171 does not necessarily need to perform the interpolator function since at the end of the pipeline.

Selected components of the ADC 100 must be at least as accurate as the intended resolution of the ADC 100. In the particular embodiment shown, for example, the ADC 100 is a 14-bit converter, so that the track and hold circuits 127, 129 each have at least 14-bit accuracy. The Main Ladder 139 receives the +/–REF signal and develops a stack of intermediate reference voltage levels and is accurate to at least 14 bits in the embodiment shown. A calibration circuit 131 is provided for periodically calibrating the Main Ladder 139 to achieve and maintain the requisite accuracy. Calibration circuits 133 and 135 are provided for periodically calibrating the preamplifiers 143 and 151 to achieve and maintain the requisite 14-bit accuracy. It is desired that remaining components have a relative or requisite degree of accuracy depending upon their functionality, design criterion and overall impact on the digital output value DOUT. The flash ladder 136, for example, has a relatively loose linearity requirement due to digital error correction and resolves only 4 bits at a time. The resistors of the flash ladder 136 and the flash converter 137 are designed to meet a speed specification (~80 MS/s) rather than accuracy. The flash converter 137 also only needs sufficient accuracy to resolve the 4 most significant bits and to select the appropriate subrange of the Main Ladder 139. Also, each of the flash converters 145, 153, 161 and 169 need only resolve 4 bits at a time. The digital logic controller 107 includes a calibration sequencer and control circuit 130 for controlling operation of the calibration circuits 131, 133 and 135. It is understood that each stage may be narrowed or widened to resolve less or more bits, respectively, for different applications.

In the exemplary embodiment shown, each of the five flash converters 137, 145, 153, 161 and 169 contribute a respective 4-bit digital or binary value, shown as DV1, DV2, DV3, DV4 and DV5, respectively, ranging from most significant to least significant, to the 20-bit DDB 121. In particular, the DDB 121 includes bit signals DDB(20 . . . 1) with DDB(20) being the most significant bit (MSB). The flash converter 137 provides DV1 as the MSB's DDB[20 . . . 17], the flash converter 145 contributes DV2 as the next bits DDB[16 . . . 13], the flash converter 153 contributes DV3 as the next bits DDB[12 . . . 9], the flash converter 161 contributes DV4 as the next bits DDB[8 . . . 5], and the flash converter 169 contributes DV5 as the least significant bits (LSB) DDB[4 . . . 1] of the DDB 121. The error correction circuit 123 regularly combines the 20 bits of the DDB 121 to generate the 14-bit DO value as further described below. The flash converters 137, 145, 153 and 161 each asserts a corresponding MUX select value M1, M2, M3 and M4, respectively, to the Main Mux 141, the MUX1 149, the MUX2 157 and the MUX3 165, respectively, for subranging the Main Ladder 139, the ILadder1 147, the ILadder2 155 and the ILadder3 163, respectively. The digital select values M1–M4 are related to the digital values DV1–DV4 according to a selected one of a number of possible coding schemes known to those skilled in the art. The format of the digital select values M1–M4 is chosen for the particular configuration and operation of the respective muxes, as further described below.

The flash ladder 136 comprises a fully differential resistor ladder using the +/–REF signals at either end to develop a sequential and differential stack of reference voltages. Each flash converter 137, 145, 153, 161 and 169 comprises a stack of comparators, each comparator consisting of a preamplifier and regenerative latch. During a first MCLK time period P1, the track and hold circuit 127 tracks the AIN signal. At a first falling edge (FE1) of the MCLK signal, the track and hold circuit 127 holds the S1 sampled signal to the flash converter 137. During the following MCLK period P2 between FE1 and the next rising edge of the MCLK signal (RE1), the flash converter 137 compares the S1 signal with each of the stack of reference voltages of the flash ladder 136. At the end of the MCLK period P2 at RE1, the flash converter 137 latches the flash preamplifier outputs and decodes the first 4-bit digital value DV1 representing the relative level of the S1 signal between the +/−REF signals. Since the S1 signal is expected to be within the +/−REF signal range and each flash preamplifier compares a corresponding interpolated reference signal with S1, the F1 flash converter 137 effectively decodes a transition point of the S1 signal in the range of the flash ladder 136.

The M1 value is provided to the Main MUX 141. At the next falling edge of the MCLK signal (FE2) beginning an MCLK period P1+1 between RE1 and FE2, the Main MUX 141 selects a subrange portion of the Main Ladder 139. The selected portion of the Main Ladder 139 includes sufficient overlap, as further described below, to ensure that the sampled signal is contained within the selected range and to provide digital redundancy for digital error correction. The Main Ladder 139 also receives the +/−REF signals at either end and comprises a series of primary resistors forming a resistor string, where each primary resistor is further divided by a subladder of resistors. In this manner, the +/−REF signals are finely divided into a sequential series of intermediate reference voltages by the Main Ladder 139. The Main MUX 141 comprises a switch matrix coupled to each of the subladder elements of the Main Ladder 139, and applies the selected portion or residual signal across first inputs of the Preamps1 143 during the P1+1 period. Meanwhile, the track and hold circuit 129 tracks the S1 signal during the MCLK period P2 and holds the S2 signal at the level of the S1 signal until FE2. The S2 signal, being a delayed equivalent of the originally sampled AIN signal, is applied to second inputs of the Preamps1 143. The Preamps1 143 comprise a stack of amplifiers having a predetermined gain for amplifying the differential between the S2 signal and a corresponding voltage level within the selected subrange of reference voltages the Main Ladder 139.

During the MCLK period P1+1, the amplified residual signal from the Preamps1 143 is applied across the ILadder1 147 and to the inputs of the F2 flash converter 145. The ILadder1 147 interpolates the amplified residual signal, and the F2 flash converter 145 makes a digital decision based on the amplified residual signal to determine the second digital value DV2. The decode of the F2 flash converter 145 is similar to the decode performed by the F1 flash converter 137, and is based on a zero crossing point within the range of the ILadder1 147. At the next falling edge of the MCLK signal (FE2) beginning an MCLK period P2+1 between FE2 and the next rising edge (RE2), the F2 flash converter 145 latches the DV2 value, which is asserted on the DDB 121. The F2 flash converter 145 provides the M2 signal to the MUX1 149, where the M2 signal reflects the DV2 value. The MUX1 149 comprises a bank of switches coupled to the interpolation resistors of the ILadder1 147. During the P2+1 MCLK period, the MUX1 149 selects a portion of the ILadder1 147 and provides the selected portion across the inputs of the Preamps2 151. The M2 signal and the MUX1 149 are configured in such a manner that allows selection of an error correction band of approximately half the interpolation range on either side of the selected portion of the ILadder1 147. Although operation of the Preamps2 151 is similar to operation of the Preamps1 143, the Preamps2 151 do not amplify based on reference signals but instead amplifies the differential output voltages of the selected portion of the ILadder1 147.

During the P2+1 MCLK period, The ILadder2 155 interpolates the amplified residual signal from the Preamps2 151, and the F3 flash converter 153 makes a digital decision based on the residual signal to determine the third digital value DV3 and the M3 value. The decode of the F3 flash converter 153 is similar to the F2 flash converter 145 based on a zero crossing point within the range of the ILadder2 155. At RE2 beginning an MCLK period P1+2 between RE2 and the next falling edge (FE3), the F3 flash converter 153 latches the DV3 value on the DDB 121 and generates the M3 value, which is provided to the MUX2 157. The MUX2 157 also comprises a bank of switches which are coupled to the interpolation resistors of the ILadder2 155, and the M3 value and MUX2 157 are configured to select an error correction band of approximately half the interpolation range on either side of the selected portion of the ILadder2 155. During the P2+1 MCLK period, the MUX2 157 selects a portion of the ILadder2 155 and provides the selected portion across the inputs of the Preamps3 159. The Preamps3 159 amplify the differential outputs of the selected portion of the ILadder2 155.

Configuration and operation of the next stage 117 is similar to the stage 115, where the ILadder3 163 interpolates the amplified residual signal from the Preamps3 159, and the F4 flash converter 161 makes a digital decision based on the residual signal to determine the fourth digital value DV4 and the M4 value. At FE3 beginning an MCLK period P2+2 between FE3 and the next rising edge (RE3), the F4 flash converter 161 latches the DV4 value, provides the M4 value to the MUX3 165 and asserted on the DDB 121. The MUX3 165 selects a portion of the ILadder3 163 and provides the selected portion across the inputs of the Preamps4 167, which amplify the differential outputs of the selected portion of the ILadder3 163.

In the final stage 119, the ILadder4 171 receives the amplified residual signal from the Preamps4 167. The ILadder4 171, however, does not include interpolation switches since the end of the pipeline has been reached, although it performs the averaging function for the Preamps4 167 as previously described. The F5 flash converter 169 makes a digital decision based on the residual signal to determine the fifth digital value DV5, which is latched onto the DDB 121 at RE3. At FE2, the track and hold circuit 127 holds the next sample on the S1 signal provided to the flash converter 137. At RE2, the flash converter 137 latches and decodes the next 4-bit digital value DV1 as the first digital value of the next sample of the AIN signal. Operation proceeds in this manner so that the error correction circuit 123 receives a completely new set of digital values DV1–DV5 at the next rising edge (not shown) of MCLK after RE3. In this manner, a new set of digital values is received by the error correction circuit 123 after each subsequent rising edge of the MCLK signal. New samples are continuously propagated in a synchronous manner at the sampling rate through the stages 111–119 so that the DOUT value tracks the AIN signal. A relatively insignificant delay of 3 MCLK cycles initially occurs to fill the stages of the pipeline, so that the DOUT signal is the digital representation of the AIN signal with a latency of 3 clock cycles.

Figure 2:
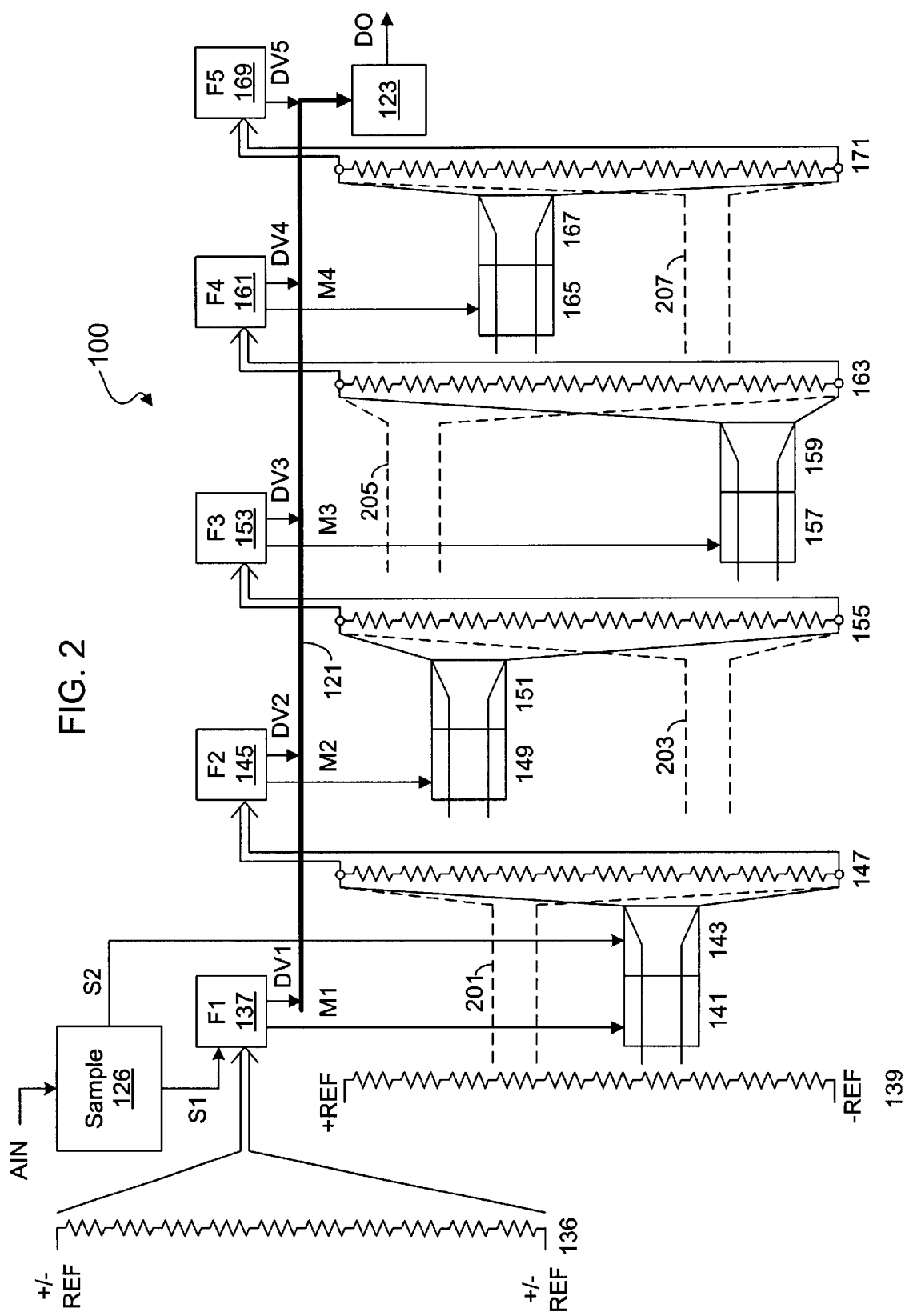
FIG. 2 is a simplified schematic and block diagram generally illustrating the subranging, amplification and interpolation operation of the ADC of FIG. 1.

FIG. 2 is a simplified schematic diagram generally illustrating the subranging, amplification and interpolation operation of the ADC 100. The illustration is shown in single-ended format for clarity of explanation where it is understood that the ADC 100 operates in full differential mode. The flash ladder 136 is referenced to the +/−REF signals and serves as the flash ladder for the F1 flash converter 137. The S1 sample of the AIN signal is provided from the sample circuit 126 to the F1 flash converter 137, which compares S1 to the reference signals to decode the DV1 value and the M1 value. The M1 value is provided to the Main MUX 141, which selects a corresponding subrange of the Main Ladder 139 also referenced to the +/−REF signals. The selected subrange of the Main Ladder 139 is provided to the preamplifiers 143, which amplify the residual signal between the selected tap voltages and the S2 sample. The subrange selection and amplification is fully differential and includes a mirrored differential portion shown at 201. The amplified residual signal is applied across the ILadder1 147, which interpolates the amplified residual signal and serves as a flash ladder for the F2 flash converter 145. The F2 flash converter 145 decodes the DV2 and M2 values based on a zero-crossing point of the ILadder1 147, where the M2 value is used by the MUX1 149 to select a corresponding subrange of the ILadder1 147. The selected subrange voltage taps of the ILadder1 147 are provided to the preamplifiers 151, which amplify the differential output voltages of the selected portion of the ILadder1 147 and apply the amplified residual signals to the ILadder2 155. A mirrored differential portion shown at 203 is included.

Operation is similar for the remaining components of the ADC 100. The resistive ladders 155, 163 and 171 operate as flash ladders for the F3, F4 and F5 flash converters, respectively. The F3, F4 and F5 flash converters each decode based on the respective amplified residual signals for determining the respective DV3, DV4 and DV5 digital values and the M3 and M4 values. The MUXs 157 and 165 use the M3 and M4 digital values to subrange the ladders 155 and 165, respectively. The preamplifiers 159 and 167 amplify the subrange tap voltages and apply the respective amplified residual signals to the resistive ladders 163 and 171 respectively. Mirrored differential portions shown at 205 and 207 are included in the respective stages. The final resistive ladder 171 does not include interpolation switches since further interpolation is not needed to achieve the desired output value. The error correction circuit 123 uses the digital values DV1-5 to generate the DO value as described further below.

Figure 3:
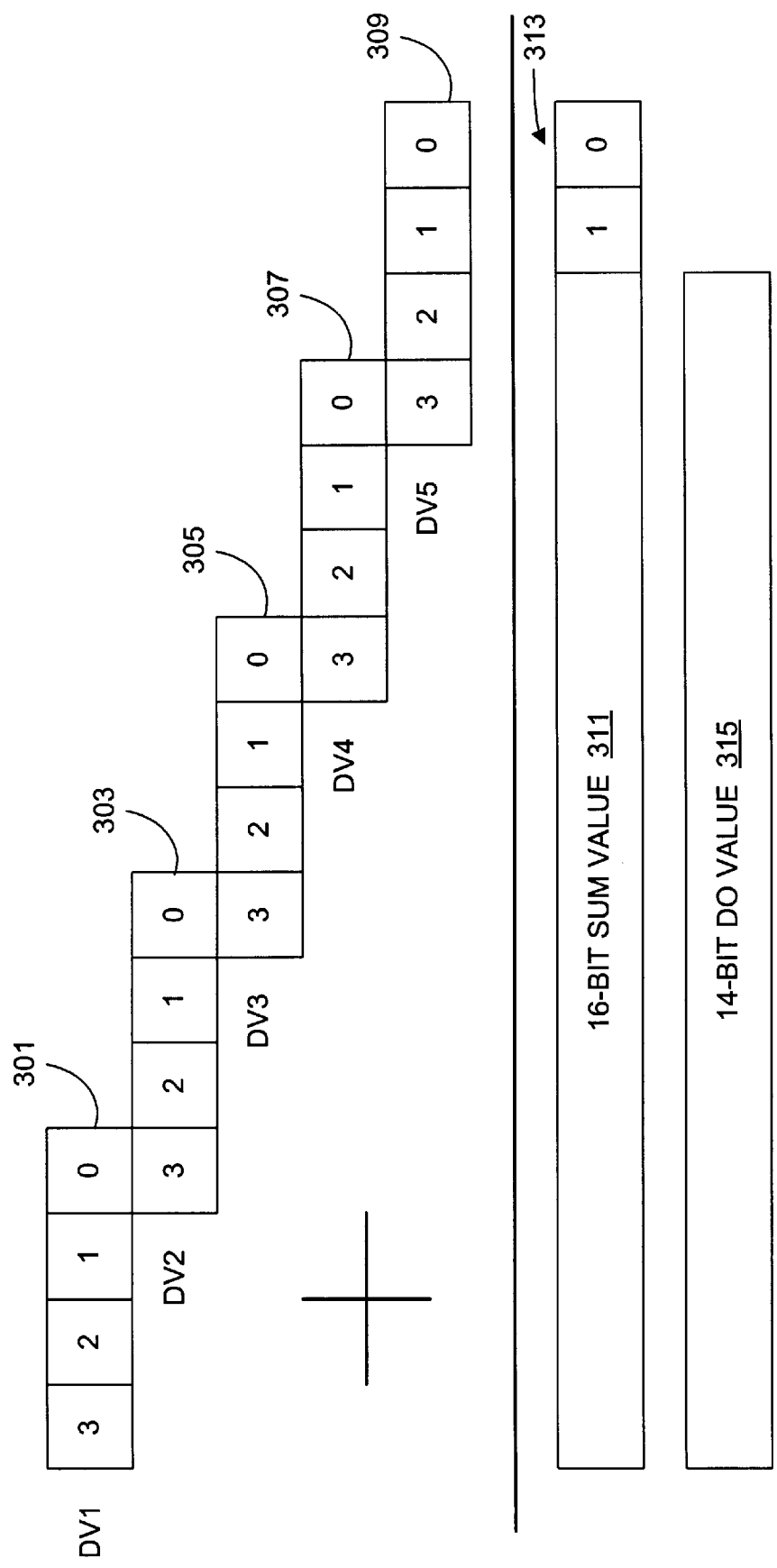
FIG. 3 is a figurative block diagram illustrating an exemplary operation of the error correction circuit of FIG. 1 to combine partial and preliminary digital values to resolve the output digital values.

FIG. 3 is a figurative block diagram illustrating an exemplary operation of the error correction circuit 123 that aligns and combines the DV1–DV5 values. The four bits, labeled 3, 2, 1 and 0, respectively, of each of the digital values DV1, DV2, DV3, DV4 and DV5, as shown at 301, 303, 305, 307 and 309, respectively, are added together to result in a 16-bit sum value as shown at 311. In particular, the 0 bit of DV1 is aligned with the fourth (3) bit of DV2, the 0 bit of DV2 is aligned with the fourth (3) bit of DV3, the 0 bit of DV3 is aligned with the fourth (3) bit of DV4, and the 0 bit of DV4 is aligned with the fourth (3) bit of DV5 and the addition is performed. The last two least significant (and least accurate) bits, shown at 313, of the resultant 16-bit sum value 311 are discarded, resulting in the final 14-bit DO value 315. The DO value 315 is provided to the inputs of the I/O buffers/drivers 125, which assert the DOUT value.

In the exemplary embodiment shown, the digital logic controller 107 and/or the error correction circuit 123 includes appropriate buffer and/or latch circuitry and memory (not shown) to store associated digital values DV1–DV5 for each MCLK cycle. During the first operative clock cycle after initialization, a first valid DV1 value is asserted on the DDB 121 and is stored. In the second clock cycle, a first DV2 value corresponding to the first DV1 value is valid and a second, new DV1 value replaces the first DV1 value on the DDB 121. The new DV1 and DV2 values are stored and the new DV2 value is associated with the first DV1 value. Subsequently, in the third clock cycle, the DDB 121 includes a third DV1 value, a second DV2 value and a first DV3 value. The first DV1, DV2 and DV3 values are stored together or otherwise associated with each other and the second DV1 and DV2 are stored together or otherwise associated with each other. Operation proceeds in this manner so that the first occurrences of DV1–DV5 are stored together or otherwise associated with each other, the second occurrences of DV1–DV5 are stored together or otherwise associated, etc. Upon completion of each set, the error correction circuit 123 performs the alignment and addition of associated values and outputs a new DO signal for every MCLK cycle.

Figure 4:
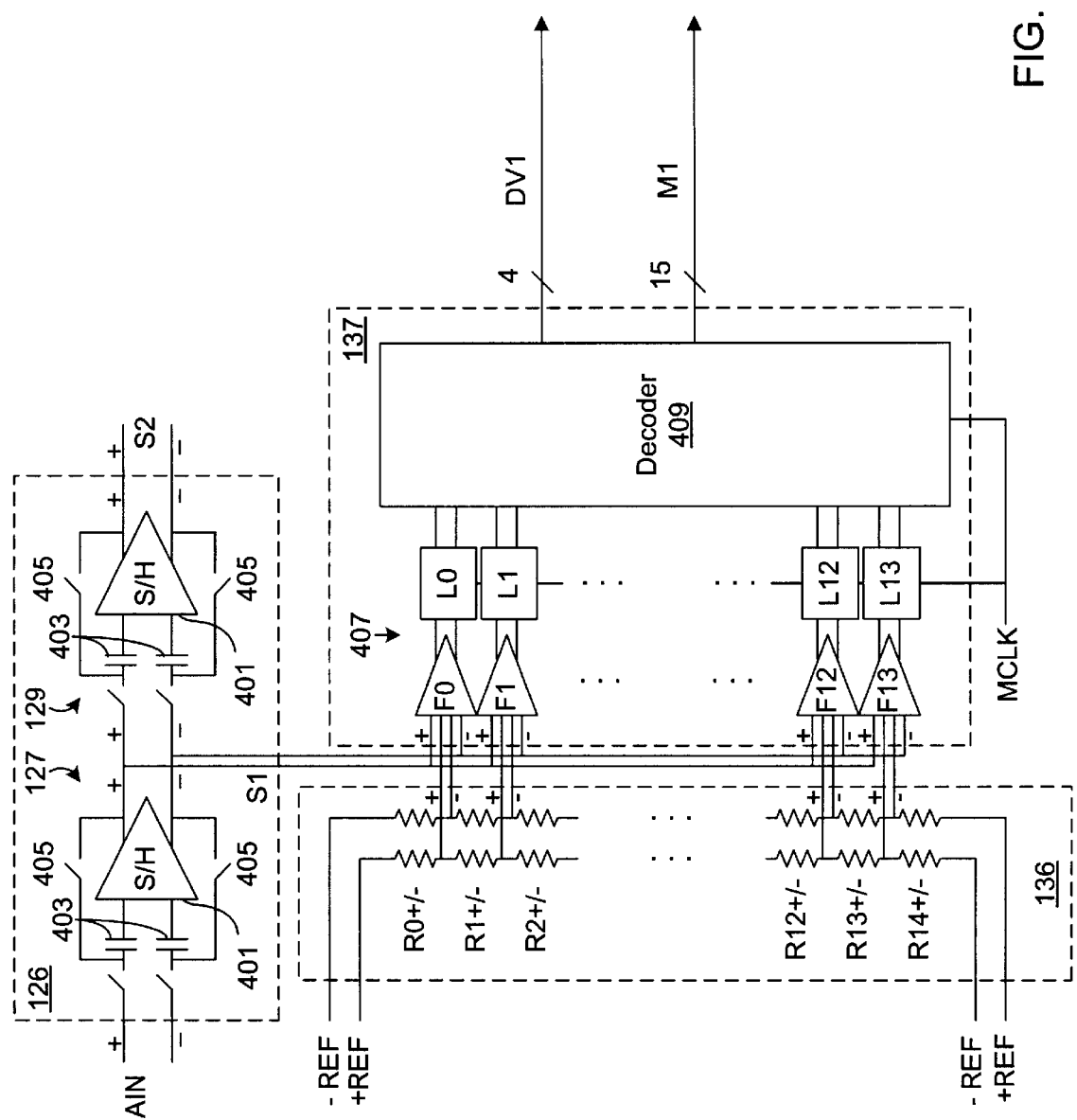
FIG. 4 is a more detailed schematic diagram of an exemplary embodiment of the sample circuit, the Flash ladder (FLadder) and the F1 flash converter of FIG. 1.

FIG. 4 is a more detailed schematic diagram of an exemplary embodiment of the sample circuit 126, the flash ladder 136 and the flash converter 137. Each of the track and hold circuits 127 and 128 are configured in a substantially identical manner and are shown in simplified form, each including an operational amplifier (op-amp) 401, a pair of sampling capacitors 403, each sampling capacitor coupled to a respective one of the positive and negative input terminals of the op-amp 401, and a pair of sampling switches 405 coupled in feedback mode including a first switch coupled between the positive capacitor and positive output terminal and a second switch coupled to the negative capacitor and negative output terminal. The positive and negative output terminals of the op-amp 401 of the track and hold circuit 127 develop the differential S1 signal and are coupled to the positive and negative input terminals, respectively, of the op-amp 401 of the of the track and hold circuit 129. The AIN signal is a differential signal provided across the positive and negative inputs of the track and hold circuit 127 and the positive and negative outputs of the track and hold circuit 129 develop the differential S2 signal. As described previously, the track and hold circuits 127 and 129 operate according to the make before break function to hold samples of the AIN signal for an additional time. It is appreciated that many different sample or tracking circuits as known to those skilled in the art may be used instead of the particular configuration illustrated.

In the embodiment shown, the sampled signals S1 and S2 are maintained at a sufficiently high degree of linearity to achieve better than 14-bit accuracy during the sampling process. A charge pump circuit (not shown) associated with an input sampling switch for each track and hold circuit maintains the linearity requirement by linearizing the sampling switch, which is achieved by maintaining constant voltage (and therefore constant resistance) across the switch under various signal conditions. Such technique of sampling in which only the switch and the capacitor are performing the sampling process is classified as open loop sampling, which achieves the highest bandwidth at the input limited only by the time constant of the switch and capacitor combination. Further details are beyond the scope of the present disclosure. It is appreciated that any suitable sampling technique may be employed depending upon the level of accuracy desired in particular configurations.

The flash ladder 136 is configured in fully differential form including a first resistive ladder having a predetermined polarity and a reverse or flipped polarity resistive ladder, each resistive ladder including 15 operative resistors coupled in a series between the +REF signal and the −REF signal. In particular, a first resistive ladder includes resistors R0+, R1+, . . . , R14+ coupled in series between the +/−REF signals in which the −REF signal is coupled to R14+ and the +REF signal is coupled to R0+. A flipped polarity resistive ladder includes resistors R0−, R1−, . . . , R14− coupled in series in which the −REF signal is coupled to R0− and the +REF signal is coupled to R14−. Such configuration establishes 14 intermediate differential nodes at the respective junctions between each complementary pair of resistors of the dual ladder configuration. Each of the resistors R0+/− to R15+/− have a nominally equal value to divide the reference voltages +/−REF into successive intermediate values at the intermediate differential nodes having a nominally constant differential voltage step size.

The flash converter 137 includes 14 comparators 407, each including input sampling capacitors (not shown), a preamplifier (F) and a latch (L). The 14 preamplifiers are individually labeled F0–F13, and each includes a pair of differential inputs. A first differential input of each preamplifier receives the S1 signal and a second differential input is coupled to a respective differential junction of the flash ladder 136. In particular, the first preamplifier F0 is coupled to the differential junction between the resistors R0+/− and R1+/−, the second preamplifier F1 is coupled to the differential junction between the resistors R1+/− and R2+/−, and so on. The 14 latches, individually labeled L--L13, each have a differential input coupled to respective outputs of the preamplifiers F0–F13. The latches assert differential outputs to a decoder 409. Each of the preamplifiers F0–F13 amplifies a difference between the sample signal S1 and the intermediate differential voltage at the corresponding junction of the flash ladder 136. In one embodiment, the latches L0–L13 comprise simple cross-coupled dynamic latches, where each latch resolves to one of two stable states upon activation at the rising edge of the MCLK signal.

The magnitude of the AIN signal is expected to be within the voltage range of +/−REF. If AIN has a voltage greater than the intermediate voltage between resistors R0+/− and R1+/− or less than the intermediate voltage between resistors R13+/− and R14+/−, then one or more consecutive latches L0–L13 output a binary one (1) value and the remaining latches output a binary zero (0) value. Given the outside overlapping resistors R0+/− and R14+/−, it is possible that all of the latches L0–L13 output 0$b$ or 1$b$ (where the "b" indicates a binary value). In this manner, the collective latches L0–L13 have 15 possible states ranging between all binary 0's to all binary 1's. The decoder 409 asserts the 4-bit binary DV1 value ranging between 0000b to 1110b reflective of the number of latches that output binary 1's, which further represents the relative value of AIN with respect to the +/−REF voltage range with at least 3 bits of accuracy. The decoder 409 also asserts the M1 value having 15 different select lines M1(0)–M1(14) for selecting a subrange of the Main Ladder 139. The details of operation of the M1 value are described further below.

The decoder 409 may be implemented in any desired manner as known to those skilled in the art, such as one or more levels of stacks of logic gates to identify the transition point. For example, a configuration including a first stack of two-input NOR gates, each having its inputs coupled to inverting or non-inverting outputs of the comparators 407, and its output coupled to a corresponding input of a second layer of OR logic gates, may be used to resolve the binary state of the comparators 407 and the DV1 value. Another logic circuit may be provided to develop the M1 value directly from the outputs of the comparators 407 or indirectly from the latched value of DV1.

Figure 5:
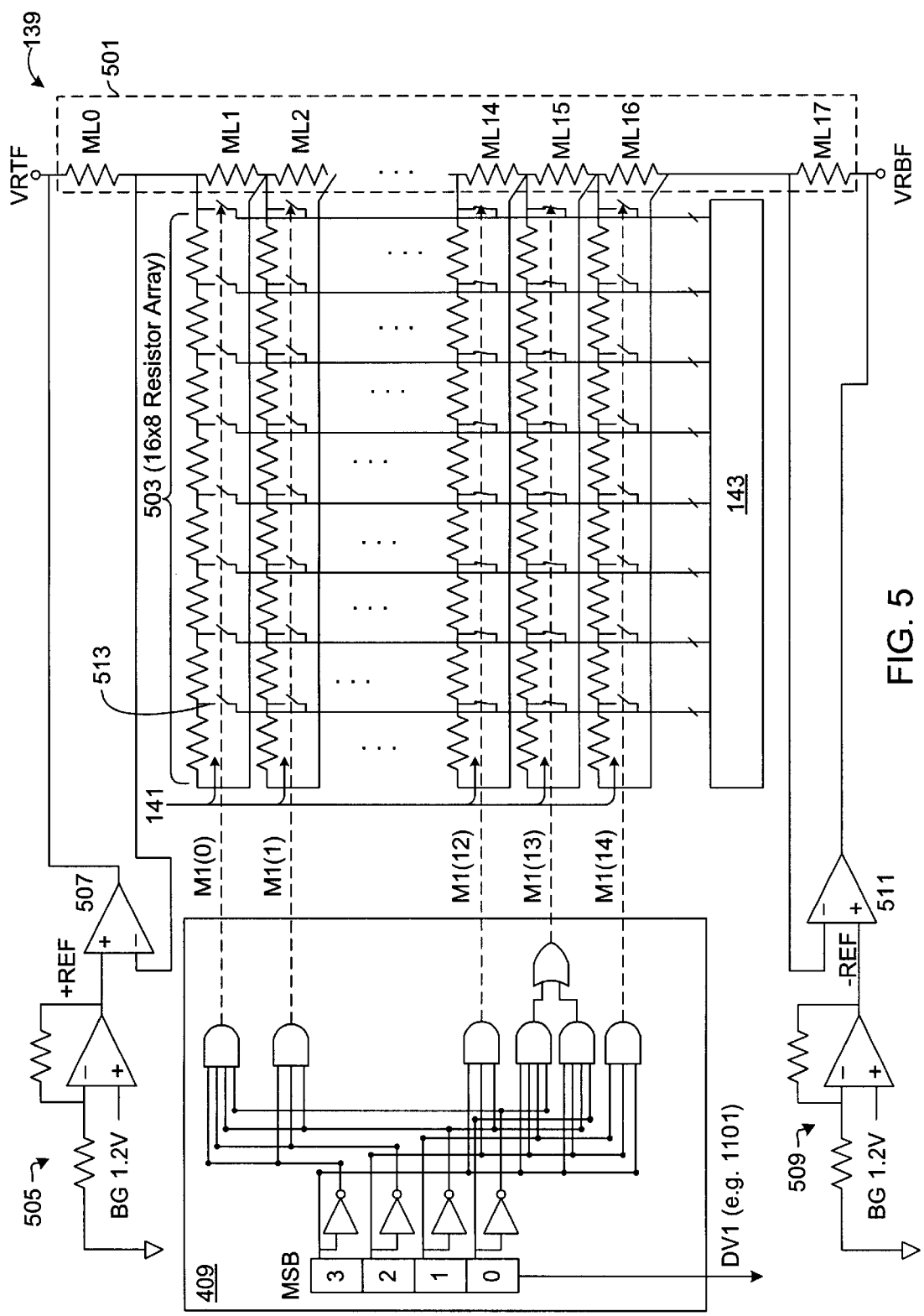
FIG. 5 is a more detailed schematic diagram illustrating interconnection between and partial configuration of the reference circuit, the Main ladder, the MUX1, the Preamps1 and the decoder of the F1 flash decoder of FIG. 1.

FIG. 5 is a more detailed schematic diagram illustrating interconnection between and partial configuration of the reference circuit 103, the Main ladder 139, the MUX1 141, the Preamps1 143 and the decoder 409 of the F1 flash decoder 137. The Main ladder 139 includes a primary resistor ladder 501, which includes 18 coarse resistors ML0–ML17 connected in series between reference voltages VRTF and VRBF. Each of the resistors ML0–ML17 have approximately equal resistance and a junction is located between each pair of resistors. The outer two resistors ML0 and ML17 are "dummy" resistors coupled to a force and sense circuit to avoid parasitic resistance and to help maintain linearity of the Main Ladder 139 in the configuration shown. In particular, the force and sense circuit eliminates variances of parasitic resistance and thus eliminates undesirable voltage variations throughout the resistive ladder. The reference circuit 103 includes an internal bandgap bias circuit (not shown) and first and second feedback amplifier circuits 505 and 509, where a temperature-independent reference bandgap voltage is applied to the feedback amplifier circuits 505 and 509. The first feedback amplifier circuit 505 develops the +REF signal and the second feedback amplifier circuit 509 develops the −REF signal. The +REF signal is provided to the non-inverting input of an op-amp 507, having its output coupled to the outer side of the resistor ML0 of the resistor ladder 501 forming the voltage node VRTF. The other side of the resistor ML0 is coupled to one side of the next resistor ML1 in the ladder and to the inverting input of the op-amp 507. In a similar manner, the −REF signal is provided to the non-inverting input of an op-amp 511, having its output coupled to the outer side of the resistor ML17 of the resistor ladder 501 forming the voltage node VRBF. The other side of the resistor ML17 is coupled to one side of the next resistor ML16 in the ladder and to the inverting input of the op-amp 511. In this manner, the +/−REF voltages are maintained across the inner 16 resistors ML1–ML16 of the resistor ladder 501. Also, since the resistors have relatively equal resistance, the +/−REF voltage is effectively subdivided into 15 intermediate voltage levels with approximately equal step size between each successive junction.

The Main Ladder 139 also includes a 16×8 resistor array 503 coupled to the resistor ladder 501, where each resistor in the resistor array 503 has an approximately equal resistance. In particular, the resistor array 503 includes 16 sets of 8 series-coupled resistors, where each resistor set is coupled in parallel with a corresponding one of the main resistors ML1–ML16. Thus, a first 8 resistors are connected in series and the series combination is coupled in parallel with the resistor ML1, a second 8 resistors are connected in series and the series combination is coupled in parallel with the resistor ML2, and so on. Each group of 8 resistors provides 7 intermediate junctions, so that each voltage across each of the main resistors ML1–ML16 is further sub-divided to include 7 intermediate voltage levels with approximately equal step size between each successive junction. In this manner, the +/−REF reference voltage is effectively subdivided into 128 different voltage levels for purposes of comparison with the S1 signal for purposes of flash conversion, subranging, amplification of the selected subrange, and interpolation. The calibration circuit 131 is coupled to the Main Ladder 139 and the digital logic controller 107 for period measurement and calibration to maintain the requisite linearity and accuracy.

The MUX1 141 comprises a switch array including at least one normally-open switch coupled to each operative junction of the Main Ladder 139, including the junctions between each main resistor ML1–ML16 and each sub-junction between each resistor of each group of 8 resistors of the resistor array 503. An exemplary normally-open switch 513 is referenced in the Figure, where each switch is configured in substantially identical manner. Although the simplified illustration shows multiple switches across the array coupled together, it is understood that each individual switch provides a separate signal to the Preamps1 143 so that each vertical signal line into the Preamps1 143 represents multiple signals. Although each switch is illustrated as a single switch, in one configuration each switch may include up to four separate switches since the Main Ladder 139 is intended to be operated in a fully differential configuration. For every switch shown that is "activated" or closed to provide a signal to the Preamps1 143, an opposite or mirror switch in the ladder is also activated to provide a differential signal. Although any two switches may be "reversed" for the opposite polarity signal, such would require additional logic to resolve the switching process, which would further require additional time thereby potentially slowing down the switching process. Instead, an additional pair of switches is provided at each junction to handle the opposite polarity differential signal. In this manner, there are a total of four switches at each junction to achieve a fully-differential resistor ladder configuration.

Each switch of the MNUX1 141 is controlled by a corresponding one of the M1(0)–M1(14) signals asserted by the decoder 409 of the F1 flash converter 137. As shown, each of the M1 signals controls the eight switches coupled to the intermediate junctions of the resistor array 503 and between a corresponding two resistors of the resistor ladder 501. As described previously, the decoder 409 determines the 4-bit DV1 value, where each bit is shown within the decoder as bits 3, 2, 1 and 0 in which bit number 3 is the MSB. For each DV1 binary value, the decoder 409 also asserts two consecutive M1 signals corresponding to two consecutive resistors of the resistors ML1–ML16 of the resistor ladder 501 to achieve sufficient overlap manner. In particular, the decoder 409 asserts the first and second M1 signals M1(0) and M1(1) for a DV1 value of 0000b, the decoder 409 asserts the second and third M1 signals M1(1) and M1(2) for a DV1 value of 0001b, the decoder 409 asserts the third and fourth M1 signals M1(2) and M1(3) for a DV1 value of 0010b, and so on up to a DV1 value of 1110b, in which the decoder 409 asserts the last two M1 signals M1(13) and M1(14). A simplified logic circuit is shown within the decoder 409 to represent the logical operation based on the DV1 value; Each M1 signal activates 16 switches, including the 8 switches aligned with the corresponding resistor of the resistor ladder 501 and another set of 8 mirror switches to develop 8 differential signals (not shown). Since two M1 signals are asserted at a time, 16 differential signals are provided to the Preamps1 143 for each DV1 value.

The exemplary configuration shown illustrates operation for DV1=1101b in which the M1(13) and M1(14) signals are asserted. The MUX1 141 correspondingly activates or otherwise closes the respective switches to connect the seven junctions associated with the resistor ML14, the seven junctions associated with the resistor ML15, the junction between the resistors ML14 and ML15 and the junction between the resistors ML15 and ML16 to the Preamps1 143 for a total of 16 junctions (single-ended). Note that the junction between the resistors ML13 and ML14 is not connected. Of course, an additional 16 junctions are asserted to achieve differential signals as previously described.

Figure 6:
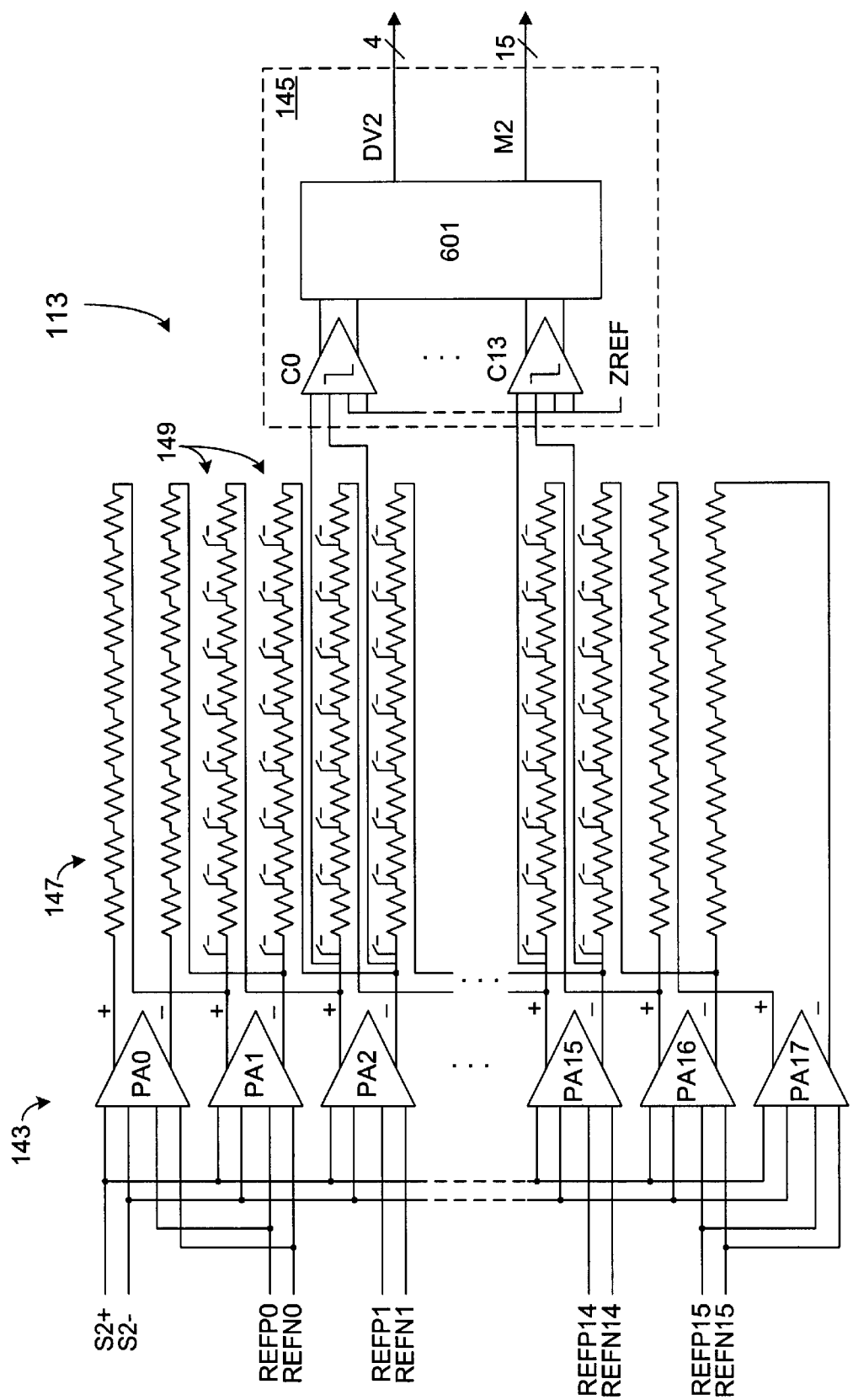
FIG. 6 is a more detailed schematic diagram of the second stage including further detail of and interconnection between the Preamps1, the F2 flash converter, the ILadder1 and the MUX1 of FIG. 1.

FIG. 6 is a more detailed schematic diagram of the stage 113 including further detail of and interconnection between the Preamps1 143, the F2 flash converter 145, the ILadder1 147 and the MUX1 149. The positive and negative polarities of the S2 signal (S2+/−) are provided to a differential input of each of the preamplifiers, shown as PA0–PA17, of the Preamps1 143. Each of the 16 differential signals from the selected portion of the Main Ladder 139 are provided to the other differential input of a respective one of the preamplifiers PA0–PA17. The Main Ladder 139 intermediate reference signals are shown as REFPx/REFNx, in which "P" denotes positive polarity, "N" denotes negative polarity and "x" is a signal index varying between 0 and 15. The REFP0/REFN0 signal is provided to the preamplifier PA1, the REFP1/REFN1 signal is provided to the preamplifier PA2, and so on. In this manner, the Preamps1 143 amplify the differential between the S2 signal and each of the selected intermediate reference signals of the selected portion of the Main Ladder 139. The Preamps1 143 include two additional or "redundant" preamplifiers PA0 and PA17 located on opposite ends of the array of preamplifiers PA1–PA16 for purposes of calibration as further described below. The additional preamplifier PA0 receives the same inputs as the preamplifier PA1 (S2 and REFP0/REFN0) and the additional preamplifier PA17 receives the same inputs as the preamplifier PA17 (S2 and REFP15/REFN15).

The ILadder1 147 includes a first polarity resistor ladder and a reverse polarity resistor ladder, where each includes 136 resistors coupled in a series configuration and where all the resistors have approximately the same resistance. The positive polarity ladder includes 17 groups of 8 resistors each, where each group of 8 resistors is coupled between the positive output terminals of a respective adjacent pair of the preamplifiers PA0–PA17. Likewise, the reverse polarity ladder includes 17 groups of 8 resistors each, where each group of 8 resistors is coupled between the negative output terminals of a respective adjacent pair of the preamplifiers PA0–PA17. In this manner, the differential outputs of the preamplifiers PA0–PA17 are interpolated into intermediate voltage levels by the ILadder1 147.

During operation, the calibration sequencer and control circuit 130 in conjunction with the calibration circuit 133 conducts a separate and independent calibration of each of the preamplifiers PA1–PA16 of the Preamps1 143. The calibration process is repeated for each of the preamplifiers PA1–PA16 in which the calibration process effectively cycles through the preamplifiers one at a time. The calibration circuitry takes the preamplifier being calibrated "out of the loop" by completely disconnecting that preamplifier. In particular, the inputs of the preamplifier being calibrated are blocked from receiving input signals and its outputs are disconnected from the ILadder1 147. Such removal, however, has minimal effect on the operation of the ADC 100 since the surrounding preamplifiers on either side of the removed preamplifier supply the voltages to the resistors of the ILadder1 147. In this manner, the voltages across the intermediate resistors of the missing preamplifier are provided by interpolation. For example, when the preamplifier PA6 is removed for calibration, the preamplifiers PA5 and PA7 drive the resistors between them to the appropriate voltage levels by interpolation. This is also true during calibration of the preamplifiers PA1 or PA16 because of the additional surrounding preamplifiers PA0 and PA17, respectively. For example, the preamplifiers PA0 and PA2 drive the intermediate resistors of the ILadder1 147 between them during calibration of the temporarily removed preamplifier PA1.

The differential outputs of the middle 14 preamplifiers PA2–PA15 are provided to corresponding differential inputs of comparators C0–C13, respectively, of the F2 flash converter 145. An exception to this occurs when a preamplifier is removed for calibration in which the corresponding resistors of the ILadder1 147 supply the interpolated voltages as previously described. The comparators C0–C13 of the F2 flash converter 145 are configured in substantially the same manner as the comparators 407 of the F1 flash ladder 137, where each comparator includes a preamplifier and latch combination as previously described. For the F2 flash ladder 145, however, one differential input of each of the comparators C0–C13 receives a zero reference signal ZREF rather than the S1 signal. Operation of the F2 flash converter 145 is substantially the same as the F1 flash converter 137 except that comparison is made with the ZREF signal rather than with the S1 signal. The F2 flash converter 145 includes a decoder 601 that resolves a zero crossing point within the amplified residual signal from the Preamps1 143 and asserts the DV2 digital value and the M2 value both indicative of the zero crossing point. The M2 signal is fed back to activate selected ones of a plurality of switches of the MUX1 149. The switches of the MUX1 149 are normally-open switches positioned at junctions between the resistors of the ILadder1 146 in a similar manner as described above for the switches of the Main MUX 141 relative to the Main Ladder 139. The configuration and operation of the MUX1 149 is somewhat different, however, as further described below.

Figure 7:
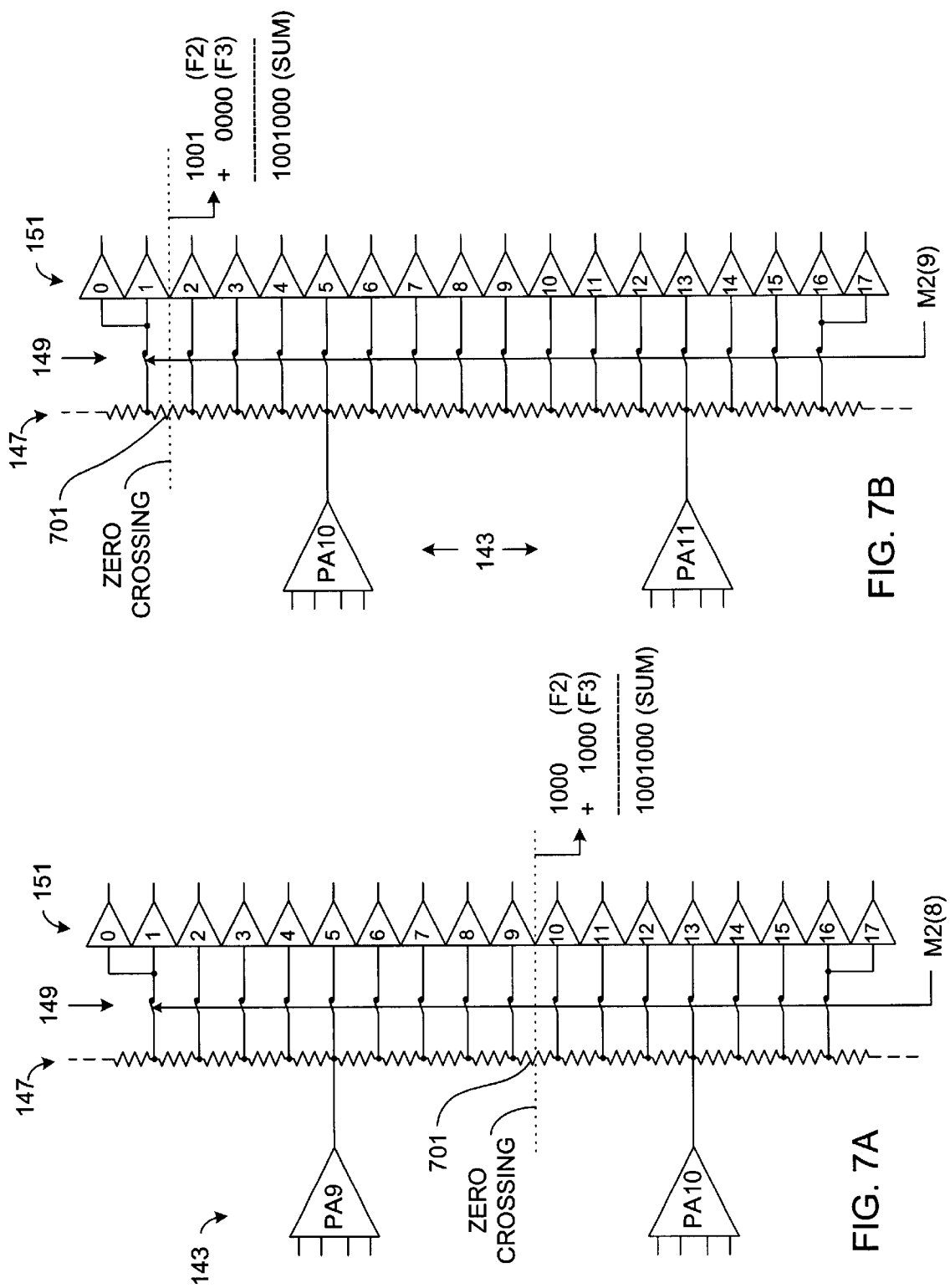
FIG. 7A is a simplified schematic diagram of selected portions of the Preamps1, the ILadder1 and corresponding switches of the MUX1 of FIG. 1.
FIG. 7B is a schematic diagram similar to FIG. 7A except illustrating digital error correction in the event voltage offsets within any of the flash converters causes an erroneous digital value to be generated.

FIG. 7A is a simplified schematic diagram of selected portions of the Preamps1 143, the ILadder1 147 and corresponding switches of the MUX1 149. Only one polarity of the differential configuration is illustrated for purposes of clarity. The MUX1 149 connects selected voltage junctions of the ILadder 147 associated with a sequential pair of the Preamps1 143 to inputs of preamplifiers PA0–PA17 of the next stage Preamps2 151 upon a particular decision by the F2 flash converter 145. Configuration and operation of the Preamps2 151 is substantially identical as the Preamps1 143. The illustrated example shows the case in which the sampled AIN signal causes a zero crossing between preamplifiers PA9 and PA10 of the Preamps1 143. Thus, one of the preamplifiers PA9 and PA10 asserts a positive value whereas the other asserts a negative value indicating the zero crossing between the pair of preamplifiers.

Given normal or otherwise ideal operation, the F2 flash converter 145 detects the zero transition and asserts a DV2 value of 1000b and also asserts the M2 signal indicative thereof. In the embodiment shown, the individual signal M2(8) is asserted, which activates corresponding switches of the MUX1 149 to assert a selected subrange of the ILadder 147 associated with the preamplifiers PA9 and PA10 to the inputs of the Preamps2 151 as shown. Further, the MUX1 149 is configured to select 16 interpolated signals, including the 2 outputs of the preamplifiers PA9 and PA10, the 7 signals between the selected preamplifiers, 4 interpolated signals immediately above the preamplifier PA9 and 3 interpolated signals immediately below the preamplifier PA10. The 4 signals above and 3 signals below represent approximately half range overlap on either side of the selected preamplifiers to ensure that the input signal being resolved is within the selected range and to provide 1-bit digital redundancy that facilitates digital error correction by the error correction circuit 123. The 16 subrange signals of the Preamps1 143 and the ILadder1 147 are then provided to the inputs of the Preamps2 151 upon closure of the switches. The Preamps2 151 is a calibrated preamplifier stage configured substantially similar as the Preamps1 143, and thus includes two extra preamplifiers PA0 and PA17 on either side of the preamplifier array.

Continuing the ideal example, suppose the zero crossing occurs somewhere in the range of a resistor 701 of the ILadder 147 that is coupled between the inputs of the preamplifiers PA9 and PA10 of the Preamps2 151. Assuming that the F3 flash converter 153 is operating with ideal conditions, it too selects a correct DV3 value of 1000b in a similar manner as the F2 flash converter 145. Given the alignment and summation of consecutive DV1 values as previously described, the correct sum value of 1001000 is achieved.

FIG. 7B is a schematic diagram similar to FIG. 7A except illustrating error correction in the event voltage offsets within any of the flash converters causes an erroneous digital value to be generated. For example, assume that the zero crossing within the Preamp1s1 147 is identical as that of FIG. 7A. In FIG. 7B, however, a voltage offset within the F2 flash converter causes the F2 flash converter to assert the M2(9) signal and a DV2 value of 1001b. Given the selected overlap, the resistor 701 is still selected so that the zero crossing is still within the selected subrange so that the signal is not lost. The digital value representing the original analog signal is incorrect, however, since DV2 is 1001b rather than the correct value of 1000b, which would appear to cause an erroneous output result at DOUT. Nonetheless, the MUX1 149 selects the interpolated subrange of signals associated with the preamplifiers PA10 and PA11 of the Preamps1 147 including 4 resistors above and 3 resistors below according to the included overlap. In this manner, the zero crossing about the resistor 701 is applied between the preamplifiers PA1 and PA2 of the Preamps2 151. The next F3 flash converter 153, which operates in a substantially identical manner as the F2 flash converter 145, outputs a DV digital value of 0000b rather than the correct value of 1000b. Although it appears that the error has been propagated to make matters worse, in actuality the error is corrected during the alignment and summation operation. In particular, the digital values DV2 and DV3 from the F2 and F3 flash converters 145 and 153 are aligned and added together as shown, resulting in the correct sum value 100100b. In this manner, as long as the flash converters 137, 145, 153, 161 and 169 accurately resolve 4 bits (and as long as the Main Ladder 139, the Preamps1 143 and the Preamps2 151 are properly calibrated), the error correction circuit 123 performs digital correction to resolve the correct digital value.

The F3, F4 and F5 flash converters 153, 161 and 169 are each configured in substantially the same manner as the F2 flash converter 145. The F5 flash converter 169, however, need not provide a corresponding M5 value since further subranging is not performed in the embodiment shown. The Preamps3 159 and Preamps4 167 are similar to the Preamps2 151 (which are similar to the Preamps1 143), except that the Preamps3 159 and Preamps4 167 are not calibrated. Thus, the additional outside preamplifiers of the preamplifier array are not necessary for the Preamps3 159 and Preamps4 167. The combination of multiplexors and resistor ladders MUX2 157 and WLadder2 155 and MUX3 and ILadder3 163 are similar in configuration and operation as the MUX1 149 and ILadder1 147. The WLadder4 171 is also similar to the ILadder1 147 except that intermediate switches and multiplex operation for subranging is not provided.

Figure 8:
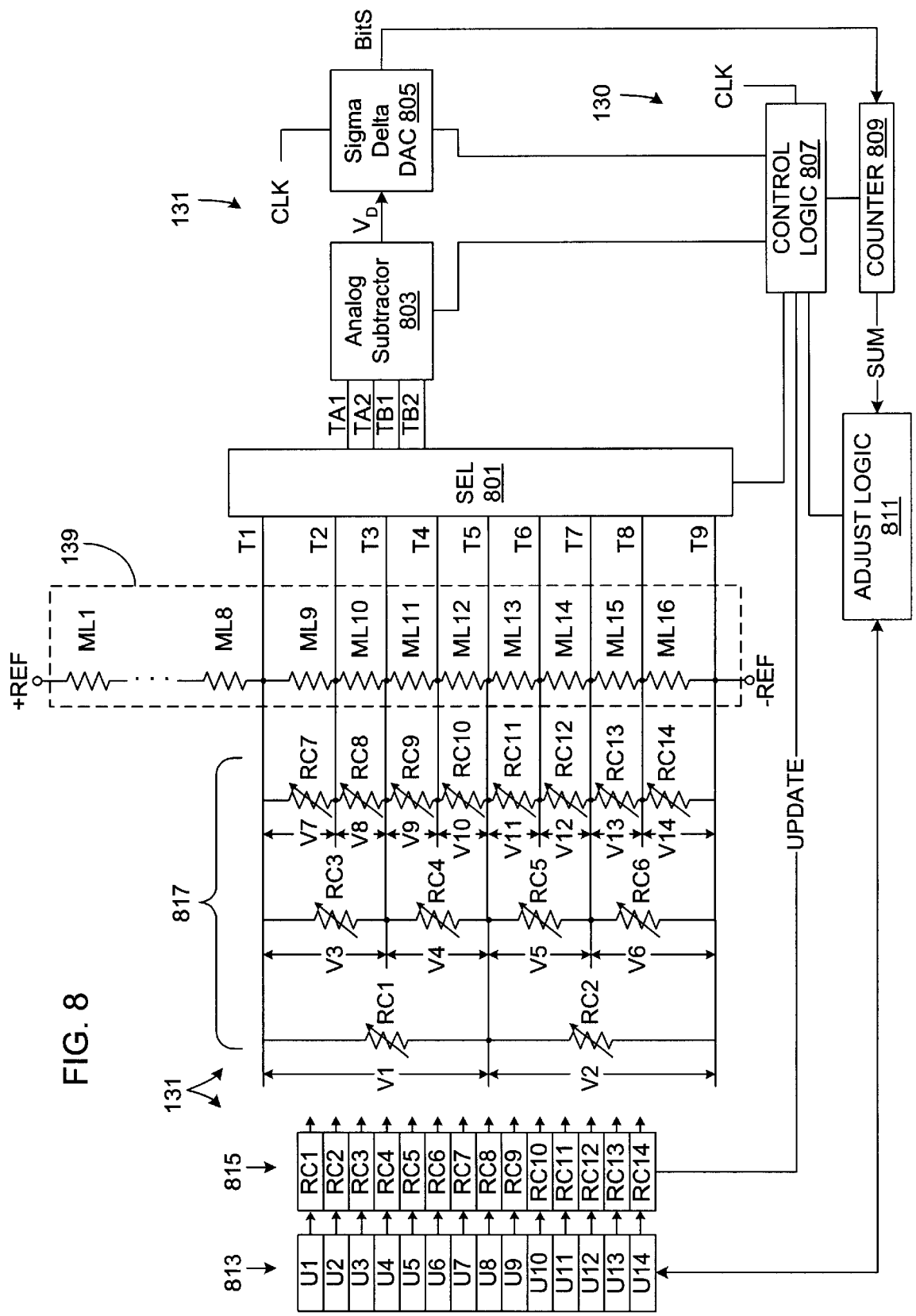
FIG. 8 is a schematic and block diagram illustrating configuration of an exemplary embodiment of the calibration circuit and a portion of the calibration sequencer and control circuit for calibrating the Main Ladder of FIG. 1.

FIG. 8 is a schematic and block diagram illustrating configuration of an exemplary embodiment of the calibration circuit 131 and a portion of the calibration sequencer and control circuit 130 for calibrating the Main Ladder 139. Since the Main Ladder 139 is used differentially as previously described, only one-half of the resistors of the Main Ladder 139 are calibrated (e.g., the bottom half). It is appreciated, however, that additional resistors up to all of the coarse resistors may be calibrated in alternative embodiments. The outer dummy resistors ML0 and ML17 are excluded and are used in conjunction with the first and second feedback amplifier circuits 505 and 509 to apply the force and sense technique to maintain the +REF and −REF voltages across the Main Ladder 139 as shown. The calibration process described herein operates in the background during normal operation and does not interrupt normal analog to digital conversion operations. The calibration process only effects normal operation by adjusting the reference voltages of the Main Ladder 139 thereby making the conversion process more accurate.

The calibration circuit 131 includes a resistor tree 817 of complementary calibration resistors coupled to the selected coarse resistors ML9–ML16 of the Main Ladder 139. In particular, the resistor tree 817 includes a first branch of 2 calibration resistors RC1 and RC2, a second branch of 4 calibration resistors RC3–RC6, and a third and final branch of 8 calibration resistors RC7–RC14. Each calibration resistor RC1–RC14 has a voltage V1–V14, respectively, and is paired with a complementary calibration resistor for the purpose of making relative measurements. Each of the calibration resistors RC7–RC14 of the last branch is coupled in parallel with a corresponding one of the coarse resistors ML9–ML16 of the Main Ladder 139, so that RC7 is coupled in parallel with the resistor ML9, RC8 is coupled in parallel with the resistor ML10, and so on. Each of the calibration resistors RC3–RC6 of the second branch is coupled in parallel with a corresponding consecutive pair of the coarse resistors ML9–ML16 of the Main Ladder 139, so that RC3 is coupled in parallel with the pair of resistors ML9 and ML10, RC4 is coupled in parallel with the pair of resistors ML11 and ML12, and so on. Each of the calibration resistors RC1 and RC2 of the first branch is coupled in parallel with a corresponding set of consecutive four of the coarse resistors ML9–ML16 of the Main Ladder 139, so that RC1 is coupled in parallel with the set of resistors ML9–ML12, and RC2 is coupled in parallel with the set of resistors ML13–ML16. As described further below, each of the calibration resistors RC1–RC14 is configured as a digitally programmable resistor.

The calibration circuit 131 includes select logic 801 controlled by control logic 807 provided within the control circuit 130. The select logic 801 is coupled to tapped junctions T1–T9, which represent the taps located on both sides of each of the coarse resistors ML9–ML16. The tapped junctions T1–T9 are used to monitor the voltage across each of the calibration resistors RC1–RC14. It is noted that each tapped junction may actually include two or more physical tap switches even though at a common junction. The select logic 801 is configured to select three of the tapped junctions T1–T9 and provide the selected junctions as outputs TA1, TA2, TB1 and TB2. The outputs TA1/TA2 provide a first voltage and the outputs TB1/TB2 provide a second voltage across a selected portion of the Main Ladder 139 that corresponds to an adjacent pair of the calibration resistors RC1–RC14. The middle outputs TA2 and TB1 are tapped from a common junction between the selected pair of calibration resistors. In particular, to select the voltages V1/V2 across the complementary pair of calibration resistors RC1/RC2, the tapped junctions T1, T5 and T9 are selected and output as TA1/TA2 and TB1/TB2. As described further below, the complementary pair of calibration resistors RC1 and RC2 are adjusted accordingly. In a similar manner, tapped junctions T1, T3 and T5 are used to select the voltages V3/V4 across complementary calibration resistors RC3/RC4, and tapped junctions T5, T7 and T9 are used to select the voltages V5/V6 across complementary calibration resistors RC5/RC6. The complementary pairs of calibration resistors RC3/RC4 and RC5/RC6 are adjusted accordingly. The tapped junctions T1–T3, T3–T5, T5–T7 and T7–T9 are used to select the voltages V7/V8, V9/V10, V11/12 and V13/V14, respectively, across complementary calibration resistor pairs RC7/RC8, RC9/RC10, RC11/RC12 and RC13/RC14, respectively. The calibration resistors RC7–RC14 are adjusted accordingly.

It is appreciated that the fourteen calibration resistors RC1–RC14 are used to calibrate the entire Main Ladder 139, and that only seven calibration measurements are needed for each measurement cycle iteration since the voltages across the calibration resistors are measured in pairs and the corresponding complementary pair of calibration resistors are adjusted in a relative manner.

The control logic 807 controls the select logic 801 to select each complementary pair of calibration resistors and to provide the corresponding pair of voltages to an analog subtractor 803. The analog subtractor 803 outputs a corresponding difference voltage $V_D$ representing a difference between the pair of voltages (e.g., the voltage difference TA1/TA2−TB1/TB2). Since each voltage of the selected pair of selected voltages represents the same number coarse resistors of the Main Ladder 139, the voltages are intended to be the same so that the difference voltage $V_D$ represents an error between the pair of voltages. The difference voltage $V_D$ is provided to the input of a sigma-delta ($\Sigma$-$\Delta$) analog to digital converter (ADC) 805, which outputs a stream of bits (BitS) representing the difference voltage $V_D$. The BitS signal is provided to a counter 809, which adds the number of 1's (or, alternatively, 0's) in the bitstream for a predetermined interval to generate a SUM value. In this manner, the SUM value represents the difference voltage $V_D$, which further represents an error between the pair of voltages being measured. The SUM value is provided to adjust logic 811, which adjusts a corresponding pair of digital update values U1–U14 of a memory 813 based on the measured SUM value. A second memory 815, coupled to the first memory 813, includes a set of fourteen digital values RC1–RC14 used to program or otherwise set the resistance values of the calibration resistors RC1–RC14. The update values U1–U14 of the memory 813 are copied into corresponding memory locations RC1–RC14, respectively, of the memory 815 upon assertion of an UPDATE signal. In this manner, the update values U1–U14 initially represent the existing resistance values of the calibration resistors RC1–RC14 prior to adjustment. The adjust logic 811 uses the existing values in the memory 813 and adjusts based on corresponding SUM values and stores adjusted values back into the memory 813.

The control logic 807 is coupled to the select logic 801, the analog subtractor 803, the sigma-delta ADC 805, the counter 809, the adjust logic 811 and the memories 813, 815 for controlling calibration operation. The control logic 807 selects each pair of calibration resistors in any desired order for each measurement interval to complete a measurement cycle. In one embodiment, the complementary pair of calibration resistors RC1/RC2 are selected first (voltages V1/V2), followed by calibration resistors RC3/RC4 (voltages V3/V4), followed by calibration resistors RC5/RC6 (voltages V5/V6), followed by calibration resistors RC7/RC8 (voltages V7/V8), followed by calibration resistors RC9/RC10 (voltages V9/V10), followed by calibration resistors RC11/RC12 (voltages V11/V12), followed by calibration resistors RC13/RC14 (voltages V13/V14) for a total of seven voltage measurements for each measurement cycle. Each voltage measurement is made during a measurement interval. For each of these seven measurement intervals, the control logic 807 controls the analog subtractor 803 to provide a corresponding difference voltage $V_D$, which is converted to a bit stream by the sigma-delta ADC 805, which is converted to the SUM value by the counter 809. The control logic 807 controls the duration of each measurement interval by the sigma-delta ADC 805, such as by selection of a number of clock cycles of a common clock signal CLK. The control logic 807 initializes (e.g., clears, resets, etc.) the counter 809 before each measurement interval, and after each measurement interval, prompts the adjust logic 811 to use the SUM value from the counter 811 to make a corresponding adjustment to a corresponding pair of the update values U1–U14. The update values U1–U14 are adjusted two at a time since each measurement interval corresponds to a relative offset between a complementary pair of calibration resistors.

After each voltage difference measurement interval, the control logic 807 selects a new pair of voltages and corresponding calibration resistors and repeats the process. The memory 815 includes a set of digital values RC1–RC14 that program the calibration resistors RC1–RC14, respectively. The update values U1–U14 correspond to the digital values RC1–RC14, respectively. For each measurement interval, the adjust logic 811 adjusts a complementary pair of the update values U1–U14, and then proceeds to the next complementary pair for the next interval. The control logic 807 may assert the UPDATE signal to update the memory 815 after each measurement interval. In the embodiment shown, however, after an entire measurement cycle of seven measurement intervals, the control logic 807 asserts the UPDATE signal to copy the update values U1–U14 to the digital values RC1–RC14, respectively, to update all of the calibration resistors RC1–RC14 at one time per measurement cycle. The control logic 807 then repeats the entire process for a continuous repeating series of measurement cycles. In this manner, once the Main Ladder 139 is calibrated, it remains calibrated throughout its entire operation period while the calibration process is operating in the background.

Figure 9:
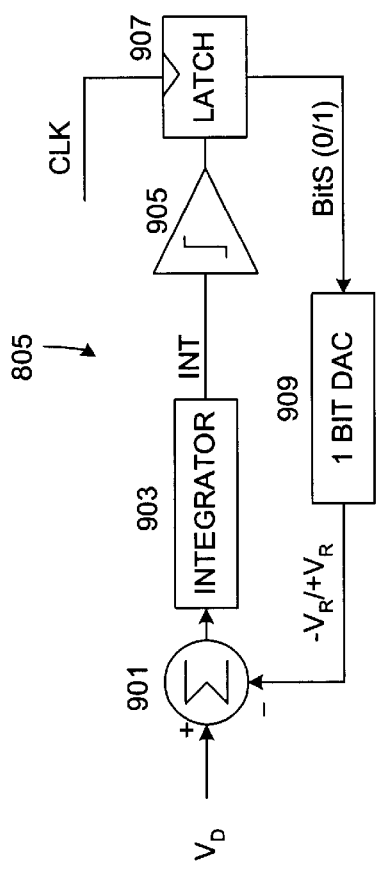
FIG. 9 is a block diagram of an exemplary embodiment of the sigma-delta analog to digital converter of FIG. 8.

FIG. 9 is a block diagram of an exemplary embodiment of the sigma-delta ADC 805. The sigma-delta ADC 805 is shown in a single-ended format where it is understood that differential operation is contemplated. The $V_D$ signal is provided to a positive input of a summing junction 901. The summing junction 901 includes a negative input coupled to the output of a 1-bit DAC 909. The summing junction 901 subtracts the output of the 1-bit DAC 909 from the $V_D$ signal and provides the output result to the input of an integrator 903. The integrator 903 integrates the difference output of the summing junction 901 and provides an INT signal indicative thereof. The INT signal is provided to the input of a comparator 905, which provides its output to the input of a latch 907. The latch 907 is clocked by clock signal CLK and asserts the bit stream BitS signal (one bit per CLK cycle) to the input of the 1-bit DAC 909. The 1-bit DAC 909 asserts a scaled reference voltage of $-V_R/+V_R$ for bit inputs of 0/1, respectively. The magnitude of $V_R$ corresponds to the scale of the voltages across the coarse resistors of the Main Ladder 139 (or the scale of expected voltage differentials) and the relative accuracy desired.

In operation, the sigma-delta ADC 805 asserts bits (0's, 1's) on the BitS signal to reflect the $V_D$ signal. The relative number of 1's and 0's determines the polarity and magnitude of the $V_D$ signal. For example, the sigma-delta ADC 805 asserts a relatively equal number of 1's and 0's if the $V_D$ signal is equal to or sufficiently close to zero. The sigma-delta ADC 805 asserts a greater number of 1's for positive $V_D$ values and a greater number of 0's for negative $V_D$ values. The relative number of 1's represents the magnitude of $V_D$. The BitS signal is provided to the counter 809 which counts the number of 1's for a given measurement interval. Of course, the 0's may be counted in an alternative embodiment. The control logic 807 determines the duration of each measurement interval, which may be programmed depending upon the relative accuracy desired. Durations of 256, 512, 1024, etc., up to 16,384 clock cycles are contemplated for the ADC 100. The size or duration of the measurement interval is considered with the resulting SUM value to reflect $V_D$. For example, if the interval is 1024 and $V_D$ is zero, then the SUM value is 512 or relatively close to a target value of 512.

In one specific configuration, the BitS output is fed to a digital decimation filter, which takes a weighted average over a fixed number of cycles. The ratio of the averaging cycle length to the modulator clock period (rate at which comparator output is latched) is called the oversampling ratio (OSR). For the ADC 100, the decimator is simply an accumulator or averager. Crudely speaking, $2^N$ BIT samples yields a resolution of about N-bits. The averaging operation filters out a significant amount of the high frequency bit-toggling noise, which is the quantization noise of the comparator 905 (1-bit analog to digital converter or ADC). Quantization noise is reduced dramatically by averaging. A 1-bit DAC is inherently linear, because it only produces 2 outputs and thus no interpolation, which would otherwise cause levels to be misplaced from a straight line. This is the fundamental reason for the high linearity potential of 1-bit oversampled ADC's.

Figure 10:
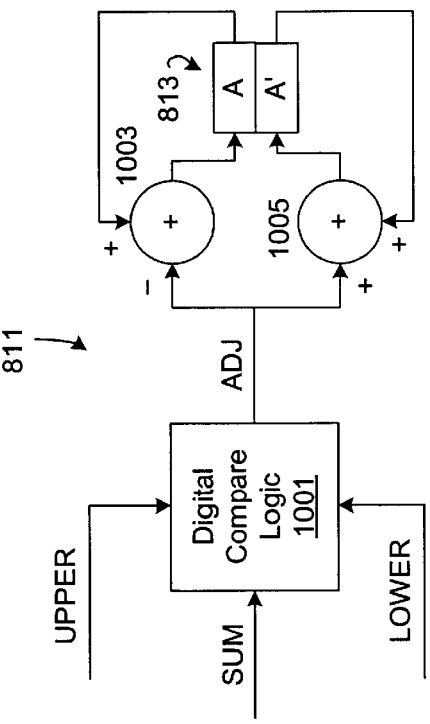
FIG. 10 is a block diagram of an exemplary embodiment of the adjust logic of FIG. 8.

FIG. 10 is a block diagram of an exemplary embodiment of the adjust logic 811. The SUM value is provided to digital compare logic 1001, which compares the SUM value with an upper threshold (UPPER) value and a lower threshold (LOWER) value. The UPPER and LOWER values are arbitrarily determined to add a hysteresis effect to buffer a certain level of noise and/or error of measurement to avoid continuous insignificant adjustments. Also, the UPPER and LOWER values are programmable to correspond to a selected measurement interval duration. For example, for a measurement interval of 512 with a target SUM value of 256, the UPPER and LOWER values may be set to any value above and below, respectively, the target SUM value within a selected range (e.g., UPPER within 257–261 and LOWER within 251–255 for range of 5 bits). The closer the thresholds are to the target SUM value, the more often adjustments are made. Both UPPER and LOWER thresholds could both be set to the target SUM value (or offset by one, e.g., 257, 255) to effectively reduce or otherwise eliminate the threshold function. The thresholds may be skewed, if desired, to provide a larger upper threshold relative to the lower threshold or vice-versa. If neither threshold is reached, then the digital compare logic 1001 sets its output adjust value to zero so that no adjustment is made since the corresponding resistors are considered within calibration thresholds. If either threshold is reached or exceeded, then the ADJ value is set to a corresponding value to correct for the measured error.

The ADJ value is provided to respective inputs of digital adders 1003 and 1005. The digital adder 1003 subtracts the ADJ value from a value received at its other input and provides the difference into a representative memory location "A" of the memory 813. The value within the memory location A is provided to the other input of the digital adder 1003. In this manner, the value in the memory location A is "reduced" by the ADJ value (increased if ADJ is negative). The digital adder 1005 adds the ADJ value to a value received at its other input and provides the sum into a representative memory location "A'" of the memory 813. The value within the memory location A' is provided to the other input of the digital adder 1005. In this manner, the value in the memory location A' is "increased" by the ADJ value (decreased if ADJ is negative). The memory locations A and A' are complements of each other and correspond to the measurement being taken to cause the SUM value. For example, if the voltages of the complementary pair of calibration resistors RC9 and RC10 were selected, then the memory locations A and A' are the complementary update values U9 and U10, respectively. The adjust logic 811 rotates through the memory locations of the memory 813 two at a time as the memory locations A and A' for each measurement interval so that all of the update values U1–U14 are updated for each measurement cycle.

In the configuration shown, the memory location A corresponds to the UPPER value and the memory location A' corresponds to the LOWER value so that the digital adders 1003, 1005 provide a negative feedback function. Prior to adjustment, the value in memory location A corresponds to the existing voltage level measured across the first calibration resistor of a complementary pair and the value in the memory location A' corresponds to the existing voltage level measured across the second calibration resistor, where the SUM value reflects the difference between the measured voltages (which corresponds to $V_D$). Thus, a positive ADJ value indicates that the value in the memory location A is too high relative to the value in the memory location A' whereas a negative ADJ value indicates that the value in the memory location A is too low relative to the value in the memory location A' (and a zero ADJ value indicates a relatively correct value for each).

The ADJ value is zero if within the UPPER and LOWER thresholds, positive if the UPPER threshold is reached or exceeded and negative if the LOWER threshold is reached or exceeded. The digital compare logic 1001 asserts the magnitude of ADJ value according to any one of several feedback correction options. In a first embodiment, the ADJ value is +1, 0 or −1 where the values in the memory locations of the memory 813 are adjusted only 1-bit (1 least significant bit (LSB)) at a time. Although this first described embodiment appears to provide the slowest adjustment, it provides very stable operation in which calibration converges relatively quickly since measurements are made in a continuous and ongoing manner. In an alternative embodiment, the magnitude of the ADJ value is proportional to the difference between the SUM and target values, such as a selected percentage of the difference. For example, if the SUM value is 270 for a target value of 256 providing a difference of 24, a half-scale adjustment based on 12 may be used. The half-scale value 12 is not necessarily the value used directly as the ADJ value, but is further scaled as necessary to provide an ADJ value that results in a half-scale reduction of $V_D$. The selected percentage is sufficiently low to avoid significant overshoot and/or possible instability of the calibration loop. Although the ADJ value could be derived to provide a full scale canceling of $V_D$ in every iteration, such may lead to jittery operation and/or potential instability.

Figure 11:
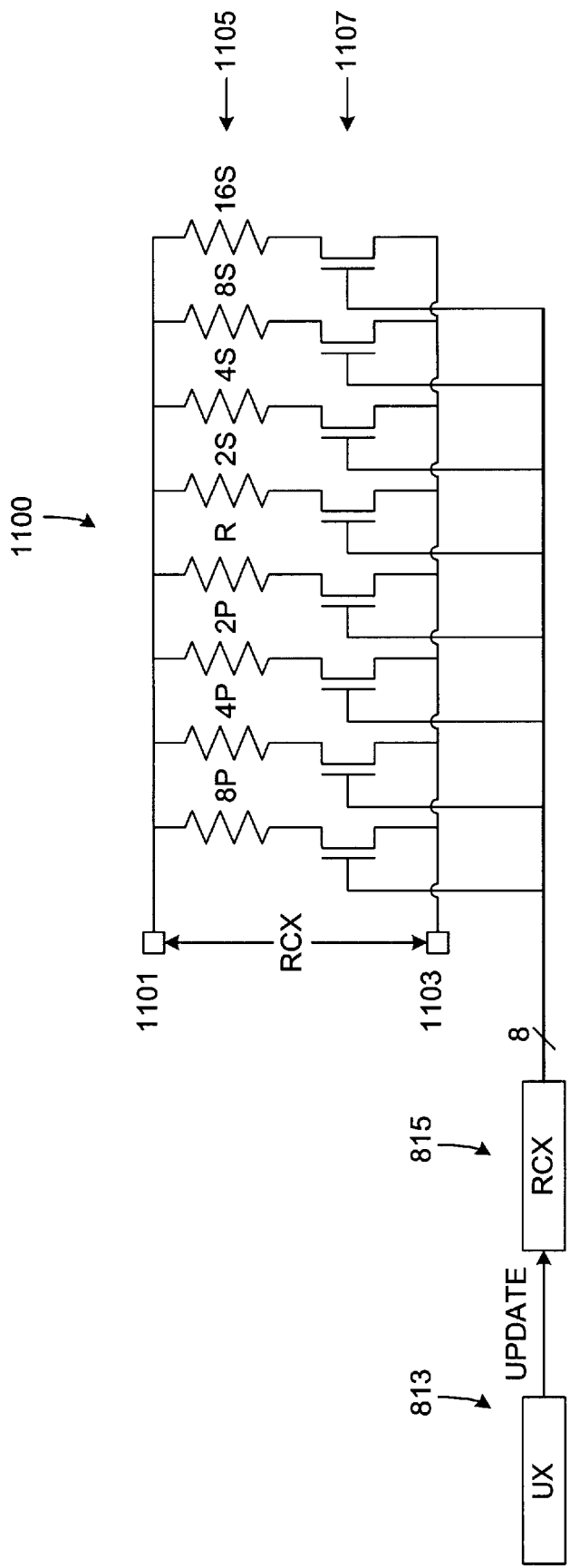
FIG. 11 is a schematic diagram of an exemplary binary weighted resistor configuration that may be used to implement any of the calibration resistors shown in FIG. 8.

FIG. 11 is a schematic diagram of an exemplary binary weighted resistor configuration 1100 that may be used to implement any of the calibration resistors RC1–RC14. A selected one of the memory locations from the memory 815, shown as memory location RCX, asserts an 8-bit digital value used to program a corresponding resistance RCX between terminals 1101, 1103 (where "X" denotes an index value 1–14). Each bit from the memory location RCX is provided to the control input (gate) of a corresponding one of a set of switches 1107, shown as field-effect transistors. Each of the switches 1107 has their sources and drains coupled between one side of a corresponding one of a set of binary weighted resistors 1105 and the terminal 1103. The other side of each of the resistors 1105 is coupled to the terminal 1101. In this manner, each bit, when asserted, places the corresponding resistor in parallel with other activated resistors to program a corresponding resistance value RCX. Also shown is the corresponding memory location UX of the memory 813, where the value in the memory location UX is copied to the memory location RCX upon assertion of the UPDATE signal to reprogram or otherwise adjust the resistance RCX.

The set of resistors 1105 are binarily weighted including notations 8P, 4P, 2P, R, 2S, 4S, 8S and 16S, where "P" denotes a parallel resistive combination of resistor of resistance "R" and "S" denotes a serial resistive combination of resistors of resistance R, where R is a reference resistance for the particular programmable resistor. The middle resistor with notation R has a resistance of R. Thus, 8P denotes 8 resistors of resistance R coupled in parallel and 8S denotes 8 resistors of resistance R coupled in series. In this manner, it is appreciated that each different digital value RCX programs a corresponding different resistance value RCX to implement a digitally-programmable resistor for each of the calibration resistors RC1–RC14. The value of the reference resistance R is arbitrary and may be the same for all of the calibration resistors. Alternatively, the value of R is corresponds to the branches of the binary resistor tree 817, which further corresponds to the number of parallel-coupled coarse resistors of the Main Ladder 139. Thus, the calibration resistors RC1 and RC2 of the first branch are based on a first reference resistance (R1), the calibration resistors RC3–RC6 of the second branch are based on a second, different reference resistance (R2), and the calibration resistors RC7–RC14 of the third branch are based on a third, different reference resistance (R3). In a specific embodiment for coarse resistors ML1–ML16 having resistance of approximately 4 ohms, the reference resistance R1 for the calibration resistors RC1 and RC2 is approximately 4.8 kilo-ohms (KΩ), the reference resistance R2 for the calibration resistors RC3–RC6 is approximately 2.4 KΩ, and the reference resistance R3 for the calibration resistors RC7–RC14 is approximately 1.2 KΩ. Of course, the reference resistance R is arbitrary and may vary depending upon the particular configuration and design criterion.

Figure 12:
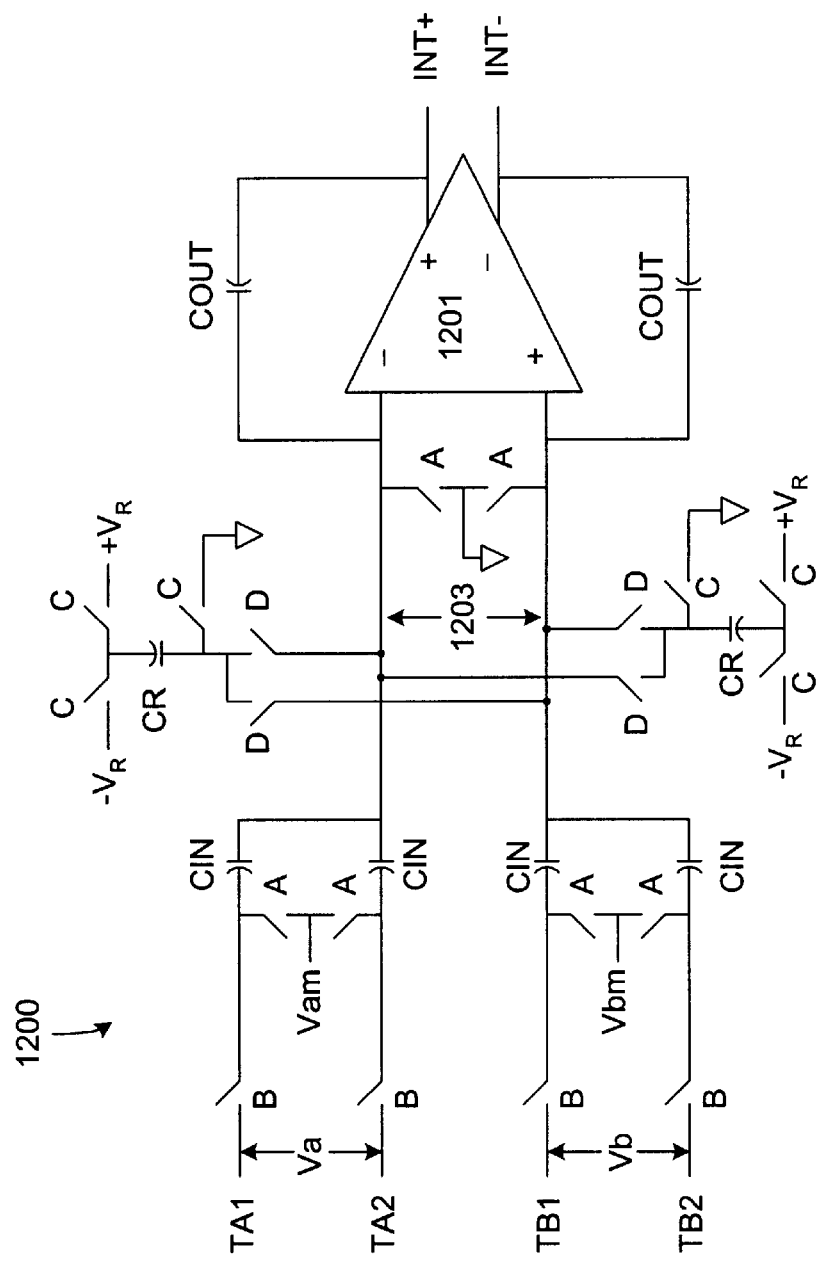
FIG. 12 is a simplified schematic diagram of an exemplary integrator amplifier that may be used to implement a combination of the analog subtractor and the summing junction and the integrator of the sigma-delta ADC of FIGS. 8 and 9.

FIG. 12 is a simplified schematic diagram of an exemplary integrator amplifier 1200 that may be used to implement a combination of the analog subtractor 803 and the summing junction 901 and the integrator 903 of the sigma-delta ADC 805. The integrator amplifier 1200 is shown in differential format. The TA1/TA2 and TB1/TB2 outputs of the select logic 801 are provided as input voltages Va and Vb, which are the sampled voltages across a selected pair of calibration resistors. A voltage level Vam is an AC common mode or "middle" voltage for the voltage Va and a voltage level Vbm is an AC common mode or "middle" voltage for the voltage Vb. The four capacitors denoted "CIN" are used to hold the sampled input voltages. The capacitors denoted CR are used to hold the feedback reference voltages $+V_R$ and $-V_R$. The capacitors denoted COUT are coupled as feedback resistors coupled between the respective and opposite input and output polarities of an amplifier 1201 to implement the integration function.

The switches denoted "A" are used to apply the middle voltages Vam and Vbm to the CIN capacitors. The switches denoted "B" are used to sample the input voltages. The switches denoted "C" are used to apply a selected one of the voltages $+V_R$ and $-V_R$ to the capacitors CR. The switches denoted "D" are used to select either $+V_R$ or $-V_R$ according to each bit of the BitS bit stream signal. In this manner, the integrator amplifier 1200 serves to take a difference between the input sampled voltages (function of the analog subtractor 803), subtract the selected $+V_R$ or $-V_R$ voltage selected by the BitS bit stream signal with the voltage difference (combined function of the 1 BIT DAC 909 and the summing junction 901), and integrate the result (function of the integrator 903). The common differential node 1203 at the differential input of the amplifier 1201 performs the subtraction functions of the analog subtractor 803 and the summing junction 901. The result at the differential output of the amplifier 1201 is a differential INT signal (+INT and −INT), which is provided to a differential comparator, shown in-single-ended format at 905.

The resistor tree 817 is an example of a binary resistor tree in which each successive branch includes twice the number of calibration resistors as the previous branch. The binary tree configuration is appropriate for calibrating a number of resistors $N=2^X$ where X is a positive integer (e.g., N=2, 4, 8, 16, etc.). Alternative resistor trees are employed for different numbers of ladder resistors. In general, each branch of the resistor tree includes one or more pairs of complementary programmable resistors coupled together at a common junction. Each programmable resistor of each branch is coupled in parallel with N/X resistors of the resistor ladder of N resistors in which X is a positive integer starting at 2 for a first branch and incremented for each additional branch to N for a final branch. However, a branch is included in the resistor tree only if N/X is an integer (e.g., 8/3, 8/5, 8/6 and 8/7 are excluded). In this manner, the first branch has two resistors and the last branch has N resistors. Any intermediate branches for non-binary cases include an odd number of complementary pairs or include programmable resistors coupled in parallel with an odd number of ladder resistors. For example, for a resistor ladder of 6 resistors, an intermediate branch may be included with three complementary pairs of calibration resistors, where each calibration resistor is in parallel with two ladder resistors. A resistor ladder of 12 resistors may include a first intermediate branch with 3 pairs, where each calibration resistor is in parallel with 4 (12/3) ladder resistors, and a second branch with 4 pairs, where each calibration resistor is in parallel with 3 (12/4) ladder resistors. Branches for X=5 or X>6 would be excluded.

The resistor tree 817 also exemplifies calibration for a resistor ladder used differentially in which only half the complete number of ladder resistors are calibrated. If the full ladder includes an odd number of resistors for any reason (e.g. 15 resistors), or if half of the resistors of the full ladder is an odd number (e.g. 7 being half of 14 resistors), then an additional resistor is included in the calibration (e.g., 8 ladder resistors for each case of 14 or 15 total ladder resistors of a differentially used ladder).

It is appreciated that a calibration technique according to embodiments of the present invention provides a high level of linearity and accuracy that is not limited to the overall passive component match for most silicon processes. Careful optimization techniques, statistical matching using arrays of passives and/or the use of dummy components in the layout of the passives are not necessary. Laser trimming or fuse blowing are not necessary. The calibration technique described herein provides a higher level of accuracy than integrated calibration techniques that measure error at the backend and that apply a correction factor. The calibration technique described herein operates continuously in the background during normal operation and is thus able to correct for ladder inaccuracies, variations or changes due to temperature, aging and/or operating conditions.

The calibration technique described herein employs relative measurement and adjustment between pairs of resistors rather than comparison with a reference value. The measurement is facilitated by a sigma-delta ADC that converts a measured voltage difference into a corresponding bit stream. Although sigma-delta techniques are relatively slow, speed is of little consequence since calibration converges sufficiently quickly. Furthermore, sigma-delta techniques are very accurate so that the calibration process maintains the resistor ladder at a sufficiently high level of accuracy. In the embodiment described herein, the programmable resistors are implemented with binary weighted resistors that are digitally controlled. The digital values controlling calibration resistance are adjusted one LSB at a time to ensure stability and to avoid jittery operation. Also, lower and upper adjustment thresholds may be employed to avoid unnecessary over-adjustments while maintaining a requisite level of accuracy.

Many modifications and other embodiments of the invention will come to mind of one skilled in the art having the benefit of the teachings presented in the foregoing descriptions and the associated drawings. Although a system and method according to the present invention has been described in connection with one or more embodiments of the invention, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A calibration system for a resistor ladder including N resistors, comprising:

a resistor tree of calibration resistors, coupled to the resistor ladder, the resistor tree including a plurality of branches wherein each branch comprises at least one pair of complementary programmable resistors coupled together at a common junction and wherein each programmable resistor of each branch is coupled in parallel with N/X resistors of the resistor ladder in which X is a positive integer starting at 2 for a first branch and incremented for each additional branch to N for a final branch and wherein a branch is included in the resistor tree only if N/X is an integer, the plurality of branches including the first branch with a pair of complementary programmable resistors each coupled in parallel with N/2 resistors of the resistor ladder and the final branch with N programmable resistors each coupled in parallel with a corresponding one of the resistors of the resistor ladder;

a measurement circuit, coupled to the resistor tree, that measures a voltage difference between a selected complementary pair of programmable resistors; and control logic, coupled to the measurement circuit and the resistor tree, that controls the measurement circuit to measure a voltage difference between each complementary pair of programmable resistors and that adjusts the relative resistance of each complementary pair of programmable resistors to achieve a more equal voltage if the voltage difference is greater than a predetermined magnitude.

2. The resistor ladder calibration system of claim 1, wherein the control logic adjusts each complementary pair of programmable resistors by increasing resistance of a first by an adjust amount and by decreasing resistance of a second by the same adjust amount.

3. The resistor ladder calibration system of claim 2, further comprising:

each programmable resistance programmable via a digital resistance value;

a first memory, coupled to the control logic and the resistor tree, that stores a plurality of digital resistance values, each digital resistance value programming a resistance of a corresponding one of the programmable resistors of the resistor tree; and a second memory, coupled to the first memory and the control logic, that stores a plurality of digital update values and wherein each of the plurality of digital update values corresponds to one of the plurality of digital resistance values.

4. The resistor ladder calibration system of claim 3, wherein the measurement circuit comprises:

an analog subtractor that measures a voltage difference between a selected complementary pair of programmable resistors; and a sigma-delta converter, coupled to the analog subtractor, that provides a bit stream representative of the measured voltage difference.

5. The resistor ladder calibration system of claim 4, further comprising a counter, coupled to the sigma-delta converter, that counts bits having a predetermined binary value of the bit stream for a predetermined measurement interval and that provides a sum value.

6. The resistor ladder calibration system of claim 5, wherein the control logic includes adjust logic, coupled to the counter and the second memory, that converts the sum value to an adjust value and that increases one digital update value by the adjust value and decreases a complementary digital adjust value by the adjust value in the second memory for the measurement interval.

7. The resistor ladder calibration system of claim 6, wherein the control logic conducts a sequential measurement cycle including performing a sequential series of measurement intervals to measure and adjust each complementary pair of programmable resistors of the resistor tree.

8. The resistor ladder calibration system of claim 7, wherein the control logic continuously repeats each sequential measurement cycle during operation.

9. The resistor ladder calibration system of claim 1, wherein the control logic asserts an update signal after each measurement cycle that causes each of the plurality of digital resistance values in the first memory to be replaced by a corresponding one of the plurality of digital update values in the second memory.

10. The resistor ladder calibration system of claim 6, wherein the adjust logic comprises:

digital compare logic, coupled to the counter, that compares the sum value with predetermined upper and lower thresholds and that sets the adjust value to zero if the sum value is within both thresholds, that sets the adjust value to one polarity if the upper threshold is reached and that sets the adjust value to an opposite polarity if the lower threshold is reached;

a digital adder, coupled to the digital compare logic and the second memory, that adds the adjust value to a first digital update value; and a digital subtractor, coupled to the digital compare logic and the second memory, that subtracts the adjust value from a second digital update value that is complementary to the first digital update value.

11. The resistor ladder calibration system of claim 4, wherein the analog subtractor comprises a switched capacitor comparator.

12. The resistor ladder calibration system of claim 3, wherein the control logic adjusts a programmable resistor by replacing a digital resistance value in the first memory with a corresponding digital update value from the second memory.

13. MOSS The resistor ladder calibration system of claim 1, wherein each programmable resistor comprises a binary weighted resistor subladder.

14. The resistor ladder calibration system of claim 13, wherein each binary weighted resistor subladder is programmed by a digital value and wherein the control logic adjusts the relative resistance by incrementing a first digital value by one least significant bit and by decrementing a second digital value by one least significant bit.

15. The resistor ladder calibration system of claim 1, wherein the resistance of and the current through the resistor tree of calibration resistors remains the same before and after each adjustment by the control logic.

16. The resistor ladder calibration system of claim 1, wherein the resistor tree of calibration resistors comprises a binary tree in which each successive branch includes twice the number of programmable resistors as a prior branch.

17. The resistor ladder calibration system of claim 1, wherein the resistor ladder is used in a differential manner and wherein the N calibrated resistors of the resistor ladder comprises at least half the number of total ladder resistors.

18. A method of calibrating a resistor ladder including N resistors, comprising:

measuring a voltage difference between a pair of ladder resistances having a common junction and including the same number of ladder resistors;

adjusting a complementary pair of programmable resistors, each coupled in parallel with a corresponding one of the pair of ladder resistances, to reduce the voltage difference to within a predetermined magnitude; and repeating said measuring and adjusting for each complementary pair of programmable resistors of a resistor tree during a measurement cycle, the resistor tree including a plurality of branches wherein each branch comprises at least one pair of complementary programmable resistors coupled together at a common junction and wherein each programmable resistor of each branch is coupled in parallel with N/X resistors of the resistor ladder in which X is a positive integer starting at 2 for a first branch and incremented for each additional branch to N for a final branch and wherein a branch is included in the resistor tree only if N/X is an integer, the plurality of branches including the first branch with a pair of complementary programmable resistors each coupled in parallel with N/2 resistors of the resistor ladder and the final branch with N programmable resistors each coupled in parallel with a corresponding one of the resistors of the resistor ladder.

19. The method of claim 18, wherein said measuring comprises:

subtracting a first voltage from a second voltage to provide the voltage difference;

converting the voltage difference to a bit stream using a delta-sigma analog to digital converter; and counting the number of bits of the bit stream having a predetermined binary value during a predetermined measurement interval to provide a sum value.

20. The method of claim 19, wherein said adjusting comprises:

converting the sum value to an adjust value; and increasing resistance of a first of the complementary pair of programmable resistors by the adjust value and decreasing resistance of a second of the complementary pair of programmable resistors by the adjust value.

21. The method of claim 20, wherein said converting comprises:

comparing the sum value to upper and lower thresholds;

setting the adjust value to zero if the sum value is within both thresholds;

setting the adjust value to one polarity if the upper threshold is reached; and setting the adjust value to an opposite polarity if the lower threshold is reached.

22. The method of claim 21, wherein said setting the adjust value further comprises setting a magnitude of the adjust value based on a difference between the sum value and a target value between the upper and lower thresholds.

23. The method of claim 21, the programmable resistors of the resistor tree being programmable by digital values, wherein said increasing resistance of a first of the complementary pair of programmable resistors comprises incrementing a first digital value by a least significant bit and wherein said decreasing resistance of a second of the complementary pair of programmable resistors comprises decrementing a second and complementary digital value by a least significant bit.

24. The method of claim 18, further comprising maintaining overall resistance of the resistor ladder before and after each measuring and adjusting.

25. The method of claim 18, further comprising continuously repeating the measurement cycle during operation of an underlying system.

* * * * *